US012593395B2

(12) United States Patent
Suzuki et al.

(10) Patent No.: US 12,593,395 B2
(45) Date of Patent: Mar. 31, 2026

(54) WIRING BOARD AND METHOD FOR MANUFACTURING WIRING BOARD

(71) Applicant: Dai Nippon Printing Co., Ltd., Tokyo (JP)

(72) Inventors: Koichi Suzuki, Tokyo (JP); Seiji Take, Tokyo (JP); Daisuke Matsuura, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 934 days.

(21) Appl. No.: 17/595,006

(22) PCT Filed: Apr. 21, 2020

(86) PCT No.: PCT/JP2020/017139
§ 371 (c)(1),
(2) Date: Nov. 5, 2021

(87) PCT Pub. No.: WO2020/226049
PCT Pub. Date: Nov. 12, 2020

(65) Prior Publication Data
US 2022/0201838 A1      Jun. 23, 2022

(30) Foreign Application Priority Data

May 7, 2019    (JP) ................................. 2019-087631
May 7, 2019    (JP) ................................. 2019-087676

(51) Int. Cl.
H05K 1/02         (2006.01)
H01Q 1/38         (2006.01)
(Continued)

(52) U.S. Cl.
CPC .............. H05K 1/025 (2013.01); H01Q 1/38 (2013.01); H05K 3/108 (2013.01); H05K 3/18 (2013.01);
(Continued)

(58) Field of Classification Search
CPC ................. H05K 1/025; H05K 1/0251; H05K 1/113–116; H05K 2201/0108; H05K 3/108; H05K 3/18
See application file for complete search history.

(56) References Cited

U.S. PATENT DOCUMENTS 8,570,225 B2     10/2013   Shoji et al.
2011/0227808 A1   9/2011   Takano et al.
(Continued)

FOREIGN PATENT DOCUMENTS

CN          102347527 A       2/2012
FR          2 995 430 A1      7/2022
(Continued)

OTHER PUBLICATIONS

Japanese Office Action (with English translation) dated Jan. 5, 2024 (Application No. 2021-518337).
(Continued)

*Primary Examiner* — Jeremy C Norris
(74) *Attorney, Agent, or Firm* — BURR PATENT LAW, PLLC

(57) ABSTRACT

A wiring board (10) includes a substrate (11) that is transparent, a wiring pattern region (20) disposed on the substrate (11) and having first-direction wiring lines (21), and a feeding unit (40) electrically connected to the first-direction wiring lines (21) of the wiring pattern region (20). Each first-direction wiring line (21) has a first region (26) positioned near the feeding unit (40) and a second region (27) that is a region other than the first region (26). A line width ($W_3$) of the first-direction wiring line (21) in the first region (26) is larger than a line width ($W_1$) of the first-direction wiring line (21) in the second region (27).

10 Claims, 17 Drawing Sheets

(51) Int. Cl.
  *H05K 3/10* (2006.01)
  *H05K 3/18* (2006.01)
(52) U.S. Cl.
  CPC . *H05K 1/0274* (2013.01); *H05K 2201/09727* (2013.01); *H05K 2201/10098* (2013.01)

(56) References Cited

U.S. PATENT DOCUMENTS

| | | | | |
|---|---|---|---|---|
| 2011/0237309 | A1* | 9/2011 | Shoji | H01Q 9/42 |
| | | | | 343/893 |
| 2015/0042420 | A1* | 2/2015 | Toonen | H01P 3/081 |
| | | | | 977/932 |
| 2016/0018348 | A1 | 1/2016 | Yau et al. | |
| 2017/0352959 | A1* | 12/2017 | Sugita | H01Q 1/2266 |
| 2018/0358675 | A1* | 12/2018 | Laighton | H01P 3/003 |
| 2020/0194862 | A1* | 6/2020 | Kamo | H01P 5/024 |
| 2020/0251813 | A1 | 8/2020 | Ryu et al. | |

FOREIGN PATENT DOCUMENTS

| | | |
|---|---|---|
| JP | 2005-142984 A | 6/2005 |
| JP | 2006-295430 A | 10/2006 |
| JP | 2008-263265 A | 10/2008 |
| JP | 2009-170474 A | 7/2009 |
| JP | 2011-066610 A | 3/2011 |
| JP | 2011-091556 A | 5/2011 |
| JP | 2011-166612 A | 8/2011 |
| JP | 2011-205635 A | 10/2011 |
| JP | 5636735 B2 | 12/2014 |
| JP | 5695947 B2 | 4/2015 |
| KR | 10-1971490 B1 | 4/2019 |
| TW | 201604735 A | 2/2016 |

OTHER PUBLICATIONS

Philipp Hügler et al., "Optically Transparent Patch Antennas at 77 GHz Using Meshed Aluminum," 2019 12th German Microwave Conference (GeMiC), Mar. 25-27, 2019, pp. 186-189 (4 pages).

Alexis Martin et al., "60 GHz Optically Transparent Patch Antenna Arrays Made of Double-Sided Micrometric Mesh Metal Layers," 2018 18th International Symposium on Antenna Technology and Applied Electromagnetics (ANTEM), IEEE, Aug. 19, 2018, pp. 1-2 (2 pages).

Extended European Search Report (Application No. 20802964.5) dated Feb. 24, 2023 (18 pages).

International Search Report and Written Opinion (Application No. PCT/JP2020/017139) dated Jul. 28, 2020 (with English translation).

Partial Supplemental European Search Report (Application No. 20802964.5) dated Dec. 23, 2022.

English translation of the International Preliminary Report on Patentability (Chapter I) dated Nov. 18, 2021 (Application No. PCT/JP2020/017139).

Taiwanese Office Action (with English translation) dated Feb. 20, 2023 (Application No. 109115076).

Japanese Office Action (with English translation) dated Jul. 18, 2025 (Application No. 2024-130143).

* cited by examiner

WIRING BOARD AND METHOD FOR MANUFACTURING WIRING BOARD

TECHNICAL FIELD

Embodiments of the present disclosure relate to a wiring board and a method for manufacturing the wiring board.

BACKGROUND ART

Presently, smaller, thinner, and lighter portable terminal devices, such as smartphones and tablets, with higher functionality are being developed. These portable terminal devices use a plurality of communication bands, and therefore require a plurality of antennas corresponding to the communication bands. For example, a portable terminal device may include a plurality of antennas including a telephone antenna, a wireless fidelity (WiFi) antenna, a third generation (3G) antenna, a fourth generation (4G) antenna, a long term evolution (LTE) antenna, a Bluetooth (registered trademark) antenna, and a near field communication (NFC) antenna. Size reduction of the portable terminal device, however, limits the space in which the antennas are arranged and narrows the design flexibility of the antennas. In addition, since the antennas are arranged in a limited space, the radio wave sensitivity is not always satisfactory.

Accordingly, film antennas mountable in a display region of a portable terminal device have been developed. A film antenna is a transparent antenna having a transparent base on which an antenna pattern is formed. The antenna pattern is formed of a conductor mesh layer having a mesh structure. The conductor mesh layer includes a conductor portion composed of an opaque conductor layer and also includes a plurality of openings in which no conductor layer is formed.

PRIOR ART REFERENCES

Patent Documents

[Patent Document 1] Japanese Unexamined Patent Application Publication No. 2011-66610
[Patent Document 2] Japanese Patent No. 5636735
[Patent Document 3] Japanese Patent No. 5695947

In the film antenna according to the related art, the electric current density tends to be higher in a region of the conductor mesh layer near a feeding unit than in other regions thereof. When the film antenna is used for a long period of time, line breakage tends to occur more often in the region of the conductor mesh layer near the feeding unit than in other regions thereof.

The present embodiments provide a wiring board that can reduce the likelihood of line breakage in the wiring pattern region near the feeding unit and also provide a method for manufacturing the wiring board.

Furthermore, it is preferable to cover the film antenna with a protective layer to protect the conductor mesh layer and the feeding unit. The feeding unit that supplies electricity to the conductor mesh layer is formed of a metal-plate member, and the metal-plate member is formed uniformly without having gaps over its entire area. Accordingly, separation may occur between the feeding unit and the protective layer that covers the feeding unit.

The present embodiments provide a wiring board that can reduce the likelihood of separation between the protective layer and the feeding unit and also provide a method for manufacturing the wiring board.

DISCLOSURE OF THE INVENTION

A wiring board according to an embodiment includes a substrate that is transparent, a wiring pattern region disposed on the substrate and having first-direction wiring lines, and a feeding unit electrically connected to the first-direction wiring lines of the wiring pattern region. In the wiring board, each first-direction wiring line has a first region positioned near the feeding unit and a second region that is a region other than the first region, and a line width of the first-direction wiring line in the first region is larger than a line width of the first-direction wiring line in the second region.

In the wiring board according to the embodiment, the wiring pattern region may have second-direction wiring lines that connect the first-direction wiring lines to one another, and the first region may be positioned between the feeding unit and at least a second-direction wiring line that is closest to the feeding unit.

In the wiring board according to the embodiment, a shape of the first-direction wiring line in the first region in plan view may be such that the line width becomes gradually small as a distance from the feeding unit becomes large.

In the wiring board according to the embodiment, a line width of the first-direction wiring line in the first region positioned near a widthwise center of the wiring pattern region may be smaller than a line width of the first-direction wiring line in the first region positioned near a widthwise edge of the wiring pattern region.

In the wiring board according to the embodiment, a length of the first region in a longitudinal direction of the wiring pattern region may be 0.1 mm or more and 0.5 mm or less.

In the wiring board according to the embodiment, the line width of the first-direction wiring line in the first region may be 150% or more of the line width of the first-direction wiring line in the second region.

In the wiring board according to the embodiment, the line width of the first-direction wiring line in the second region may be in the range of 0.1 μm to 5.0 μm.

A wiring board according to an embodiment includes a substrate that is transparent, a wiring pattern region disposed on the substrate and having first-direction wiring lines and second-direction wiring lines, and a feeding unit electrically connected to the first-direction wiring lines and the second-direction wiring lines of the wiring pattern region. In the wiring board, regions surrounded by the feeding unit, the first-direction wiring lines, and the second-direction wiring lines are formed as non-openings.

A method for manufacturing a wiring board according to an embodiment includes a step of preparing a substrate that is transparent and a step of forming a wiring pattern region having first-direction wiring lines and forming a feeding unit electrically connected to the first-direction wiring lines. The wiring pattern region and the feeding unit are formed on the substrate. Each first-direction wiring line has a first region positioned near the feeding unit and a second region that is a region other than the first region. A line width of the first-direction wiring line in the first region is larger than a line width of the first-direction wiring line in the second region.

According to the embodiment of the present disclosure, the likelihood of line breakage in the wiring pattern region near the feeding unit can be reduced.

A wiring board according to an embodiment includes a substrate that is transparent, a wiring pattern region disposed on the substrate and having wiring lines, and a feeding unit electrically connected to the wiring lines of the wiring pattern region. In the wiring board, the feeding unit has through holes or non-through holes.

In the wiring board according to the embodiment, the through holes or the non-through holes may be arranged in rows and columns at a surface of the feeding unit.

In the wiring board according to the embodiment, the through holes or the non-through holes may be disposed at equal intervals at least in one direction.

In the wiring board according to the embodiment, a width of each through hole or each non-through hole may be 50 μm or more and 500 μm or less.

In the wiring board according to the embodiment, a pitch of the through holes or the non-through holes may be 100 μm or more and 500 μm or less.

In the wiring board according to the embodiment, a protective layer may be formed on the substrate so as to cover the wiring pattern region and the feeding unit.

In the wiring board according to the embodiment, a line width of each wiring line may be in the range of 0.1 μm to 5.0 μm.

In the wiring board according to the embodiment, the wiring pattern region may function as an antenna.

In the wiring board according to the embodiment, an area of each through hole or each non-through hole or a pitch of the through holes or the non-through holes in a region of the feeding unit near the wiring pattern region may be different from that in a region of the feeding unit away from the wiring pattern region.

A method for manufacturing a wiring board according to an embodiment includes a step of preparing a substrate that is transparent and a step of forming a wiring pattern region having wiring lines and forming a feeding unit electrically connected to the wiring lines on the substrate. The wiring pattern region and the feeding unit are formed on the substrate. The feeding unit has through holes or non-through holes.

According to the embodiments of the present disclosure, the likelihood of separation between the protective layer and the feeding unit can be reduced.

DESCRIPTION OF EMBODIMENTS

Figure 1:
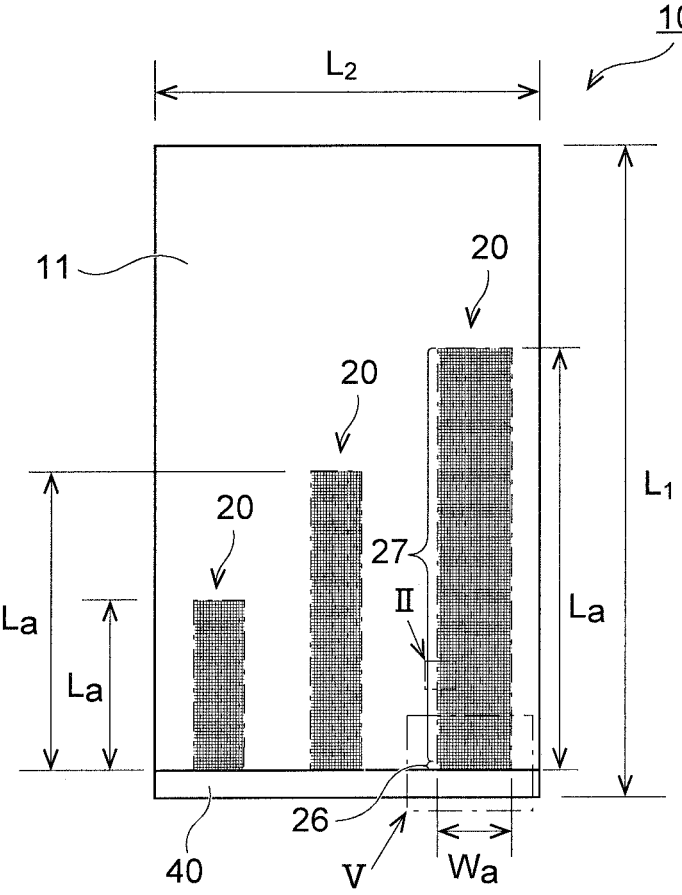
FIG. 1 is a plan view of a wiring board according to a first embodiment.
Figure 1:
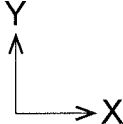

Drawings herein referred to are schematic illustrations. Sizes and shapes of components are exaggerated as appropriate so as to facilitate better understanding. Accordingly, the sizes and shapes of the components may be changed appropriately without departing from the technical idea. Note that the same components are denoted by the same reference signs in the drawings, and detailed descriptions thereof may be omitted. Materials and numerical values, such as dimensions, of the components described herein are merely examples for the embodiment. Such materials and numerical values are not construed as limiting but may be selected appropriately. In this specification, terms for specifying shapes and geometric conditions, for example, terms such as "parallel", "orthogonal", and "perpendicular", are to be interpreted so as not only to cover their strict meanings but also to cover substantially the same states as these terms represent.

In the embodiments described below, an "X direction" is a direction parallel to one of the sides of a substrate. A "Y direction" is a direction perpendicular to the X direction and parallel to another side of the substrate. A "Z direction" is a direction perpendicular to both the X direction and the Y direction and parallel to a thickness direction of a wiring board. A "front surface" is a surface of the substrate that is at the positive side in the Z direction and on which wiring lines are provided. A "back surface" is a surface of the substrate that is at the negative side in the Z direction and that is opposite to the surface on which the wiring lines are provided.

First Embodiment

The first embodiment will be described with reference to FIGS. 1 to 15. FIGS. 1 to 15 illustrate the first embodiment.

[Structure of Wiring Board]

The structure of a wiring board according to the present embodiment will be described with reference to FIGS. 1 to 5. FIGS. 1 to 5 illustrate the wiring board according to the present embodiment.

As illustrated in FIG. 1, a wiring board 10 according to the present embodiment is disposed on, for example, a display of an image display device. The wiring board 10 includes a transparent substrate 11 and wiring pattern regions 20 disposed on the substrate 11. The wiring pattern regions 20 are electrically connected to a feeding unit 40.

The substrate 11 is substantially rectangular in plan view. The longitudinal direction of the substrate 11 is parallel to the Y direction, and the transverse direction of the substrate 11 is parallel to the X direction. The substrate 11 is transparent and shaped like a flat plate. The thickness of the substrate 11 is substantially uniform over its entirety. A length $L_1$, which is the length of the substrate 11 in the longitudinal direction (Y direction), may be set in the range of, for example, 100 mm to 200 mm. A length $L_2$, which is the length of the substrate 11 in the transverse direction (X direction), may be set in the range of, for example, 50 mm to 100 mm. The substrate 11 may have rounded corners.

The material of the substrate 11 may be any material that is transparent in the visible light range and that has electrically insulating properties. The material of the substrate 11 is polyethylene terephthalate in the present embodiment, but is not limited to this. The material of the substrate 11 is preferably an organic insulating material, for example, a polyester-based resin such as polyethylene terephthalate, an acrylic resin such as polymethyl methacrylate, a polycarbonate-based resin, a polyimide-based resin, a polyolefin-based resin such as cycloolefin polymer, or a cellulose-based resin material such as triacetyl cellulose. Alternatively, the material of the substrate 11 may be glass, ceramic, etc., as appropriate depending on the use. Although the substrate 11 includes a single layer in the illustrated example, the substrate 11 is not limited to this. The substrate 11 may instead have a multilayer structure including a plurality of base materials or layers. The substrate 11 may be shaped like a film or a plate. Accordingly, the thickness of the substrate 11 is not particularly limited but may be selected as appropriate depending on the use. For example, a thickness (in the Z direction) $T_1$ of the substrate 11 (see FIG. 3) may be in the range of, for example, 10 μm to 200 μm.

In the present embodiment, the wiring pattern regions 20 are formed as antenna pattern regions that serve as antennas. In FIG. 1, the wiring pattern regions 20 (three regions) are formed on the substrate 11 and correspond to different frequency bands. More specifically, the wiring pattern regions 20 have different lengths (lengths in the Y direction) $L_a$, each of which corresponds to a specific frequency band. The lower the frequency of the corresponding frequency band, the longer the length $L_a$ of the wiring pattern region 20. When, for example, the wiring board 10 is disposed on a display 91 of an image display device 90 (to be described later, see FIG. 7), each wiring pattern region 20 may correspond to, for example, a telephone antenna, a WiFi antenna, a 3G antenna, a 4G antenna, a 5G antenna, an LTE antenna, a Bluetooth (registered trademark) antenna, or an NFC antenna.

Each wiring pattern region 20 is substantially rectangular in plan view. The longitudinal direction of each wiring pattern region 20 is parallel to the Y direction, and the transverse direction (width direction) thereof is parallel to the X direction. The length $L_a$ of each wiring pattern region 20 in the longitudinal direction (Y direction) may be set in the range of, for example, 3 mm or more and 100 mm or less. A width $W_a$ of each wiring pattern region 20 in the transverse direction (width direction) may be set in the range of, for example, 1 mm or more and 10 mm or less.

Each wiring pattern region 20 includes metal lines that form a grid structure or a mesh structure having a repeating pattern repetitive in the X direction and also in the Y direction. In other words, each wiring pattern region 20 has a pattern formed of portions extending in the X direction (second-direction wiring lines 22) and portions extending in the Y direction (first-direction wiring lines 21).

Figure 2:
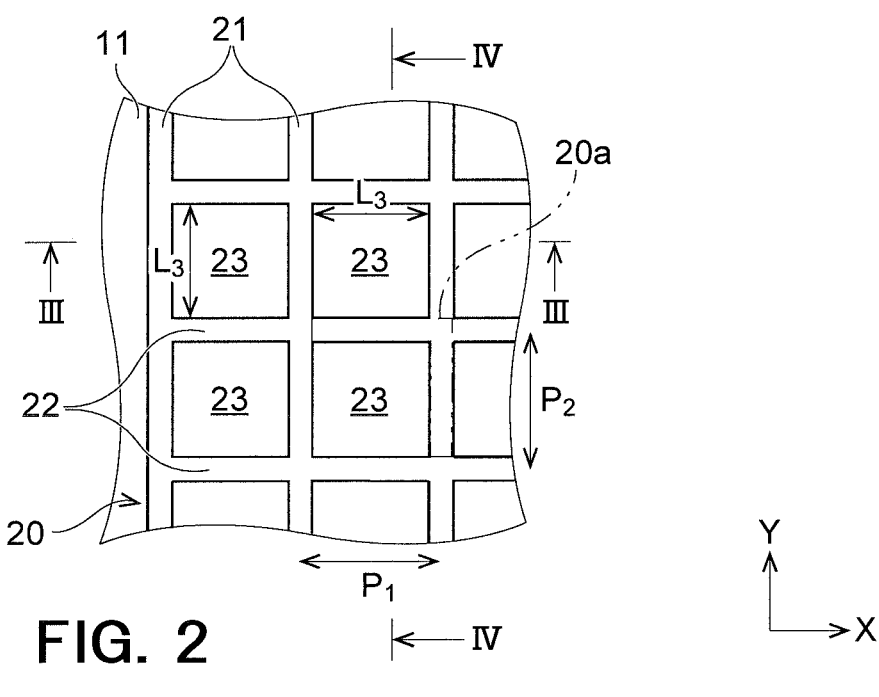
FIG. 2 is an enlarged plan view of the wiring board according to the first embodiment (enlarged view of region II in FIG. 1).

As illustrated in FIG. 2, each wiring pattern region 20 includes the first-direction wiring lines (antenna wiring lines) 21 that function as an antenna and the second-direction wiring lines (antenna-connecting wiring lines) 22 that connect the first-direction wiring lines 21 to one another. More specifically, the first-direction wiring lines 21 and the second-direction wiring lines 22 are integrated together to form a grid structure or a mesh structure. Each first-direction wiring line 21 extends in a direction (longitudinal direction, Y direction), which is the length direction corresponding to the frequency band of the antenna, and each second-direction wiring line 22 extends in a direction (width direction, X direction) orthogonal to the first-direction wiring lines 21. The first-direction wiring lines 21 have the length $L_a$ corresponding to a predetermined frequency band (above-described length of the wiring pattern region 20, see FIG. 1) and serve mainly as an antenna. The second-direction wiring lines 22 connect the first-direction wiring lines 21 to one another to reduce defects caused by breakage of a first-direction wiring line 21 or electrical disconnection between a first-direction wiring line 21 and the feeding unit 40.

Each wiring pattern region 20 has a plurality of openings 23 that are each surrounded by adjacent ones of the first-direction wiring lines 21 and adjacent ones of the second-direction wiring lines 22. The openings 23 are substantially rectangular or square in plan view. The areas of respective openings 23 are substantially equal at least within an area of second regions 27 (to be described later). The transparent substrate 11 is exposed at each opening 23. Accordingly, the overall transparency of the wiring board 10 can be increased by increasing the total area of the openings 23 per unit area of the wiring pattern region 20.

As illustrated in FIG. 2, the first-direction wiring lines 21 are arranged with intervals therebetween (at pitch $P_1$) in the width direction (X direction) of the wiring pattern region 20. The first-direction wiring lines 21 are arranged at equal intervals in the width direction (X direction) of the wiring pattern region 20. The first-direction wiring lines 21 and the second-direction wiring lines 22 are disposed at equal intervals with respect to each other. In other words, the first-direction wiring lines 21 are disposed at equal intervals, and the pitch $P_1$ may be set in the range of, for example, 0.01 mm to 1 mm. The second-direction wiring lines 22 are also disposed at equal intervals, and the pitch $P_2$ may be set in the range of, for example, 0.01 mm to 1 mm. Equidistant arrangement of the first-direction wiring lines 21 and the second-direction wiring lines 22 eliminates the size variation of the openings 23 at least within the area of the second regions 27 (to be described later). This renders the wiring pattern region 20 not readily visible. In addition, the pitch $P_1$ of the first-direction wiring lines 21 is equal to the pitch $P_2$ of the second-direction wiring lines 22 at least within the area of the second regions 27 (to be described later). The openings 23 are thereby shaped like squares in plan view within the area of the second regions 27. The transparent substrate 11 is exposed through the openings 23. Accordingly, the overall transparency of the wiring board 10 can be increased by increasing the area of each opening 23. Note that a length $L_3$, which is the length of each side of the opening 23, may be set in the range of, for example, 0.01 mm to 1 mm. The first-direction wiring lines 21 and the second-direction wiring lines 22 are arranged so as to orthogonally intersect each other, but the arrangement is not limited to this. The first-direction wiring lines 21 and the second-direction wiring lines 22 may intersect each other at an acute angle or at an obtuse angle. It is preferable that the openings 23 have the same shape and size at least within the area of the second regions 27 (to be described later). The openings 23, however, may have different shapes and sizes depending on locations.

Figure 3:
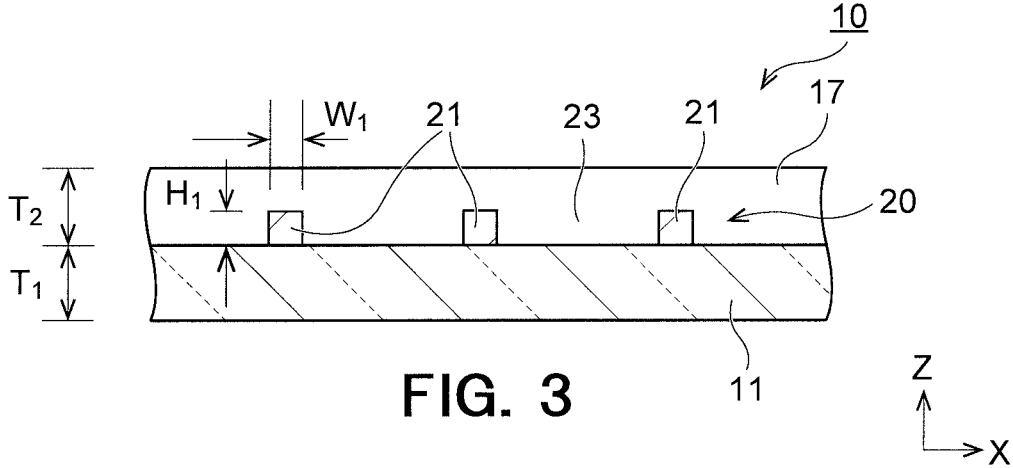
FIG. 3 is a sectional view of the wiring board according to the first embodiment (sectional view of line in FIG. 2).

As illustrated in FIG. 3, each first-direction wiring line 21 has a substantially rectangular or square cross section in a direction perpendicular to the longitudinal direction thereof (cross section in the X direction). The sectional shape of each first-direction wiring line 21 in a first region 26 (to be described later) is different from that in the second region 27. The sectional shape of the first-direction wiring line 21 in the first region 26 and the sectional shape in the second region 27 are each substantially uniform within respective regions along the first-direction wiring line 21 in the longitudinal direction (Y direction).

Figure 4:
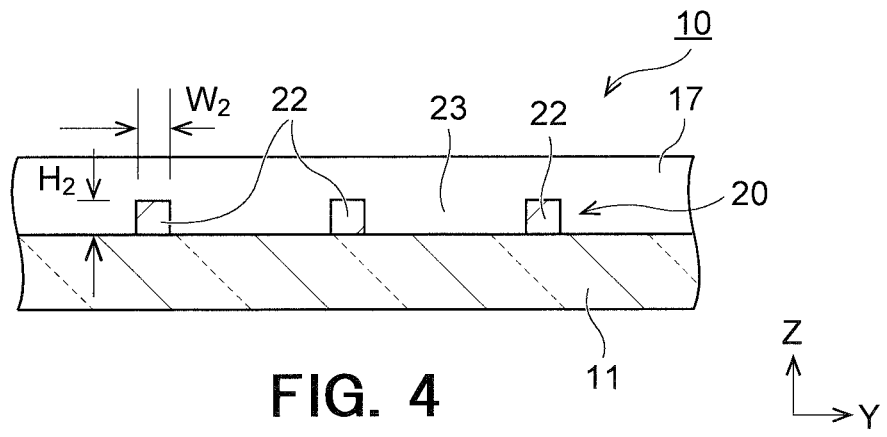
FIG. 4 is a sectional view of the wiring board according to the first embodiment (sectional view of line IV-IV in FIG. 2).

As illustrated in FIG. 4, each second-direction wiring line 22 has a substantially rectangular or square cross section in a direction perpendicular to the longitudinal direction thereof (cross section in the Y direction). The sectional shape of each second-direction wiring line 22 is substantially the same as the above-described sectional shape of each first-direction wiring line 21 (shape of cross section in the X direction) in the second region 27. The sectional shape of each second-direction wiring line 22 is substantially uniform along the second-direction wiring line 22 in the longitudinal direction (X direction). The sectional shapes of each first-direction wiring line 21 and each second-direction wiring line 22 need not be substantially rectangular or square, but may have, for example, a substantially trapezoidal shape that is narrower at the front surface side (positive side in the Z direction) than at the back surface side (negative side in the Z direction), or a shape having curved surfaces at the sides extending in the longitudinal direction.

In the present embodiment, each first-direction wiring line 21 has a line width $W_1$ (length in the X direction, see FIG. 3) in the second region 27 (to be described later), and the second-direction wiring line 22 has a line width $W_2$ (length in the Y direction, see FIG. 4) in the second region 27. The line width $W_1$ and the line width $W_2$ are not specifically limited but may be selected appropriately depending on the use. For example, the line width $W_1$ of the first-direction wiring line 21 may be set in the range of 0.1 μm to 5.0 μm, and the line width $W_2$ of the second-direction wiring line 22 may be set in the range of 0.1 μm to 5.0 μm. A height $H_1$ (length in the Z direction, see FIG. 3) of the first-direction wiring line 21 and a height $H_2$ (length in the Z direction, see FIG. 4) of the second-direction wiring line 22 are not specifically limited, either, but may be selected appropriately depending on the use. The height $H_1$ and the height $H_2$ may be set appropriately in the range of, for example, 0.1 μm to 5.0 μm.

Figure 5:
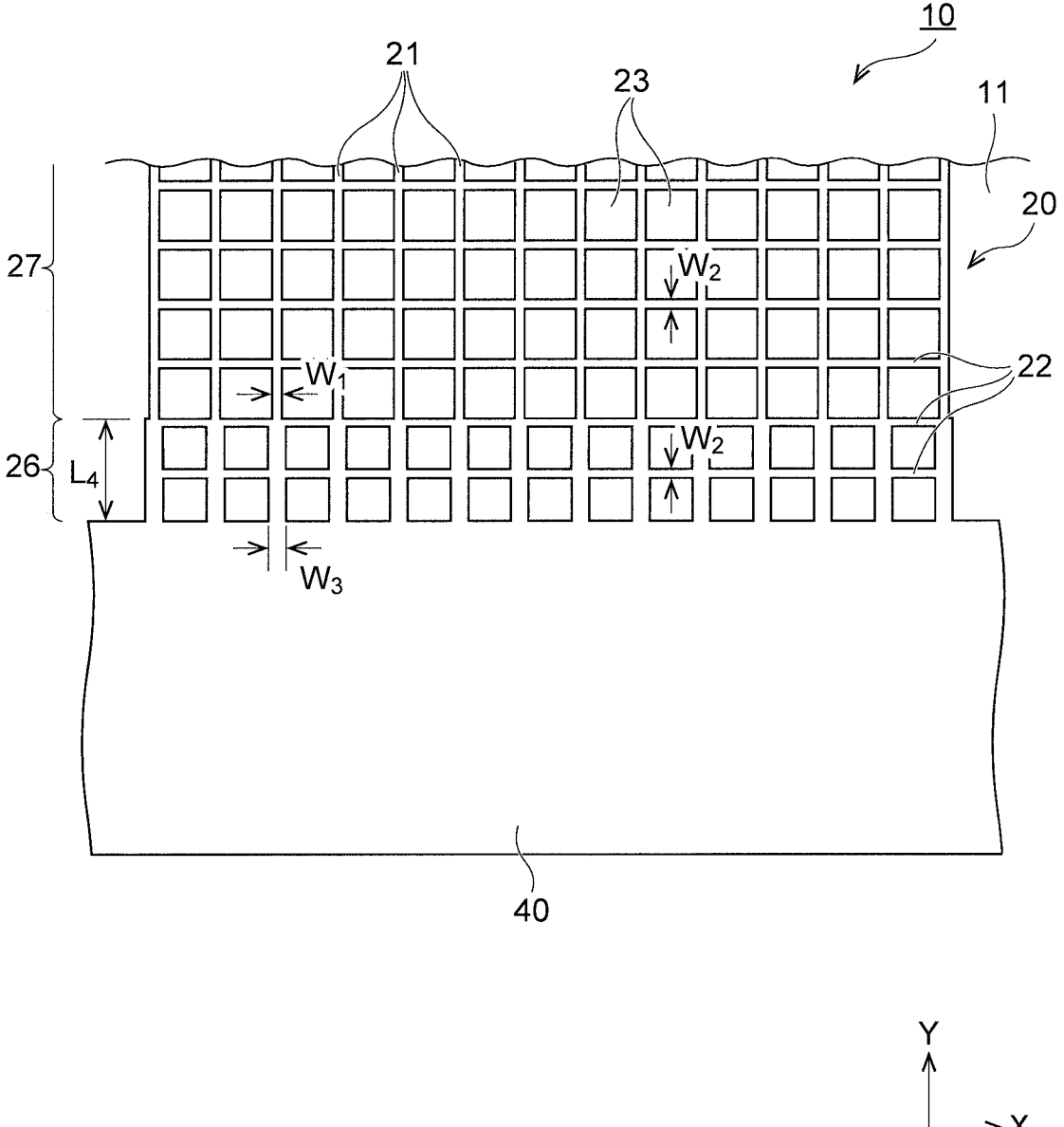
FIG. 5 is an enlarged plan view of the wiring board according to the first embodiment (an enlarged view of region V in FIG. 1).

As illustrated in FIG. 5, the feeding unit 40 is electrically connected to the portions of the first-direction wiring lines 21 facing the negative side in the Y direction. The first-direction wiring lines 21 have respective first regions 26 located near the feeding unit 40 and respective second regions 27 that are regions excluding the first regions 26.

The first regions 26 are regions that are located at the negative side in the Y direction in respective first-direction wiring lines 21 and that include respective connection portions connected to the feeding unit 40. The second regions 27 are regions that are located at the positive side in the Y direction in respective first-direction wiring lines 21. In other words, the second regions 27 are located further away from the feeding unit 40 than the first regions 26. The length of each second region 27 is greater than the length of each first region 26 in the longitudinal direction of the wiring pattern region 20 (in the Y direction).

The line width $W_3$ of the first-direction wiring line 21 in the first region 26 is set to be larger than the line width $W_1$ thereof in the second region 27. In other words, the line width of the first-direction wiring line 21 is larger in the first region 26 located near the connection portion connected to the feeding unit 40 and is smaller in the second region 27 located away from the feeding unit 40. Accordingly, the first-direction wiring line 21 has the larger line width $W_3$ at the connection portion connected to the feeding unit 40 (first region 26) where the electric current density becomes greater compared with other portions, thereby reducing the likelihood of the first-direction wiring line 21 breaking.

The line width $W_3$ of the first-direction wiring line 21 in the first region 26 is preferably set to be 150% or more of the line width $W_1$ of the first-direction wiring line 21 in the second region 27 ($1.5W_1 \leq W_3$). More specifically, the line width $W_3$ of the first-direction wiring line 21 in the first region 26 may be set in the range of 0.15 μm or more. In the present embodiment, the first-direction wiring lines 21 have the same line width $W_3$.

As illustrated in FIG. 5, the first region 26 has a rectangular shape elongated in the Y direction in plan view. The line width $W_3$ is substantially uniform within the first region 26 along the first-direction wiring line 21 in the longitudinal direction (Y direction). The second region 27 has a rectangular shape elongated in the Y direction. The line width $W_1$ is substantially uniform within the second region 27 along the first-direction wiring line 21 in the longitudinal direction (Y direction). The height $H_1$ (length in the Z direction, see FIG. 3) of the first-direction wiring line 21 is the same in the first region 26 and in the second region 27. The second-direction wiring lines 22 have the same line width $W_2$ such that the line width $W_2$ of a second-direction wiring line 22 near the feeding unit 40 is the same as that of a second-direction wiring line 22 located away from the feeding unit 40.

It is preferable that the first region 26 is located between the feeding unit 40 and at least the second-direction wiring line 22 positioned closest to the feeding unit 40 (positioned furthest toward the negative side in the Y direction). In FIG. 5, the first region 26 is located between the feeding unit 40 and a second-direction wiring line 22 that is second closest to the feeding unit 40 (the second one of the second-direction wiring lines 22 from the feeding unit 40 toward the positive side in the Y direction). However, the position of the first region 26 is not limited to this. The first region 26 may be located between the feeding unit 40 and a second-direction wiring line 22 that is N-th closest to the feeding unit 40 (N is three or more).

More specifically, a length $L_4$, which is the length of the first region 26 in the Y direction, is preferably set to be 0.1 mm or more and 0.5 mm or less. Setting the length $L_4$ of the first region 26 in the Y direction to be 0.1 mm or more enables the line width $W_3$ of the first-direction wiring line 21 to be made larger in a region near the connection portion connected to the feeding unit 40 where the electric current density becomes greater compared with other portions, thereby reducing the likelihood of line breakage of the first-direction wiring line 21. Moreover, setting the length $L_4$ of the first region 26 in the Y direction to be 0.5 mm or less reduces the likelihood that the region of the first-direction wiring line 21 having a large line width $W_3$ becomes excessively long. This reduces the likelihood of the wiring board 10 decreasing the overall transparency.

The material of the first-direction wiring lines 21 and the second-direction wiring lines 22 may be any metal material that is conductive. In the present embodiment, the material of the first-direction wiring lines 21 and the second-direction wiring lines 22 is copper but is not limited to this. Examples of the material of the first-direction wiring lines 21 and the second-direction wiring lines 22 include metal materials (including alloys), such as gold, silver, copper, platinum, tin, aluminum, iron, and nickel.

In the present embodiment, an overall opening ratio At of the wiring pattern region 20 may be, for example, 87% or more and less than 100%. When the overall opening ratio At of the wiring board 10 is set to be in this range, the wiring board 10 may be sufficiently conductive and transparent. Note that the opening ratio is a ratio (%) of the area of the opening region (region in which metal portions, such as the first-direction wiring lines 21 and the second-direction wiring lines 22, are not present and in which the substrate 11 is exposed) to the unit area in a predetermined region (for example, a portion of the wiring pattern region 20).

Referring to FIG. 1 again, the feeding unit 40 is electrically connected to the wiring pattern regions 20. The feeding unit 40 is formed of a substantially rectangular thin-plate-shaped conductive member. The longitudinal direction of the feeding unit 40 is parallel to the X direction, and the transverse direction of the feeding unit 40 is parallel to the Y direction. The feeding unit 40 is disposed at an end of the substrate 11 in the longitudinal direction thereof (an end at the negative side in the Y direction). Examples of the material of the feeding unit 40 include metal materials (including alloys), such as gold, silver, copper, platinum, tin, aluminum, iron, and nickel. The feeding unit 40 is electrically connected to a wireless communication circuit 92 of an image display device 90 (see FIG. 7) when the wiring board 10 is installed in the image display device 90. Although the feeding unit 40 is provided on the front surface of the substrate 11, the provision of the feeding unit 40 is not limited to this. The feeding unit 40 may have a portion or its entirety that is positioned outside the peripheral edge of the substrate 11.

As illustrated in FIGS. 3 and 4, a protective layer 17 is formed on the front surface of the substrate 11 so as to cover the wiring pattern regions 20 and the feeding unit 40. The protective layer 17 is provided to protect the wiring pattern regions 20 and the feeding unit 40 and is formed substantially over the entire front surface of the substrate 11. The material of the protective layer 17 may be a colorless transparent and insulating resin, for example, an acrylic resin such as polymethyl(meth-) acrylate, polyethyl(meth-) acrylate, or a modified resin or copolymer thereof, a polyester, a polyvinyl resin such as polyvinyl alcohol, polyvinyl acetate, polyvinyl acetal, polyvinyl butyral, or a copolymer thereof, a polyurethane, an epoxy resin, a polyamide, or a chlorinated polyolefin. A thickness $T_2$ of the protective layer 17 may be set as appropriate in the range of 0.3 µm to 100 µm. The protective layer 17 may be formed so as to cover at least the wiring pattern regions 20 on the substrate 11.

[Method for Manufacturing Wiring Board]

Next, a method for manufacturing the wiring board according to the present embodiment will be described with reference to FIGS. 6(a) to 6(i). FIGS. 6(a) to 6(i) are sectional views illustrating the method for manufacturing the wiring board according to the present embodiment.

The substrate 11 as illustrated in FIG. 6(a) is first prepared. A conductive layer 51 is subsequently formed on the substrate 11 over substantially the entire front surface thereof. In the present embodiment, the thickness of the conductive layer 51 is 200 nm. However, the thickness of the conductive layer 51 is not limited to this but may be selected as appropriate in the range of 10 nm to 1000 nm. In the present embodiment, the conductive layer 51 is formed by sputtering using copper. Alternatively, the conductive layer 51 may be formed by, for example, plasma CVD.

Next, as illustrated in FIG. 6(b), a photocurable insulating resist 52 is applied to the substrate 11 over substantially the entire front surface. The photocurable insulating resist 52 may be, for example, an organic resin, such as an epoxy-based resin.

Subsequently, a transparent imprinting mold 53 having projections 53a is prepared (see FIG. 6(c)) and is brought closer to the substrate 11 so as to cause the photocurable insulating resist 52 to spread between the mold 53 and the substrate 11. Next, the photocurable insulating resist 52 is exposed to light through the mold 53 to cure the photocurable insulating resist 52, so that an insulating layer 54 is formed. Thus, trenches 54a are shaped on the front surface of the insulating layer 54 by transferring the shapes of the projections 53a. The trenches 54a have a pattern corresponding to the first-direction wiring lines 21 and the second-direction wiring lines 22 in plan view.

After that, the mold 53 is separated from the insulating layer 54, so that the insulating layer 54 having a sectional structure illustrated in FIG. 6(d) is obtained. Here, it is preferable to separate the mold 53 from the insulating layer 54 in the Y direction in which the longer first-direction wiring lines 21 extend.

As described above, the trenches 54a are formed on the front surface of the insulating layer 54 by imprinting, thereby shaping the trenches 54a finely. The method for forming the insulating layer 54 is not limited to the imprinting. The insulating layer 54 may instead be formed by photolithography. In such a case, a resist pattern is formed by photolithography to expose portions of the conductive layer 51 that correspond to the first-direction wiring lines 21 and the second-direction wiring lines 22.

Referring to FIG. 6(d), an insulating material may remain at the bottom of the trenches 54a in the insulating layer 54. The remaining insulating material is removed by a wet process using a permanganate solution or N-Methyl-2-pyrrolidone, or by a dry process using an oxygen plasma. By removing the remaining insulating material as above, the trenches 54a exposing the conductive layer 51 therethrough can be formed as illustrated in FIG. 6(e).

Next, as illustrated in FIG. 6(f), the trenches 54a in the insulating layer 54 are filled with a conductor 55. In the present embodiment, the trenches 54a in the insulating layer 54 are filled with copper by electroplating using the conductive layer 51 as a seed layer.

Next, as illustrated in FIG. 6(g), the insulating layer 54 is removed. The insulating layer 54 on the substrate 11 is removed by a wet process using a permanganate solution or N-Methyl-2-pyrrolidone, or by a dry process using an oxygen plasma.

Next, as illustrated in FIG. 6(h), the conductive layer 51 on the front surface of the substrate 11 is removed. The conductive layer 51 is etched so as to expose the front surface of the substrate 11 by a wet process using aqueous hydrogen peroxide. Thus, the wiring board 10 having the substrate 11 and the wiring pattern regions 20 disposed on the substrate 11 is obtained. Here, each wiring pattern region 20 includes the first-direction wiring lines 21 and the second-direction wiring lines 22. The above-described conductor 55 has the first-direction wiring lines 21 and the second-direction wiring lines 22. The feeding unit 40 may be formed as a portion of the conductor 55. Alternatively, a flat plate-shaped feeding unit 40 may be separately prepared, and the thus-prepared feeding unit 40 may be electrically connected to the wiring pattern regions 20.

Figure 6:
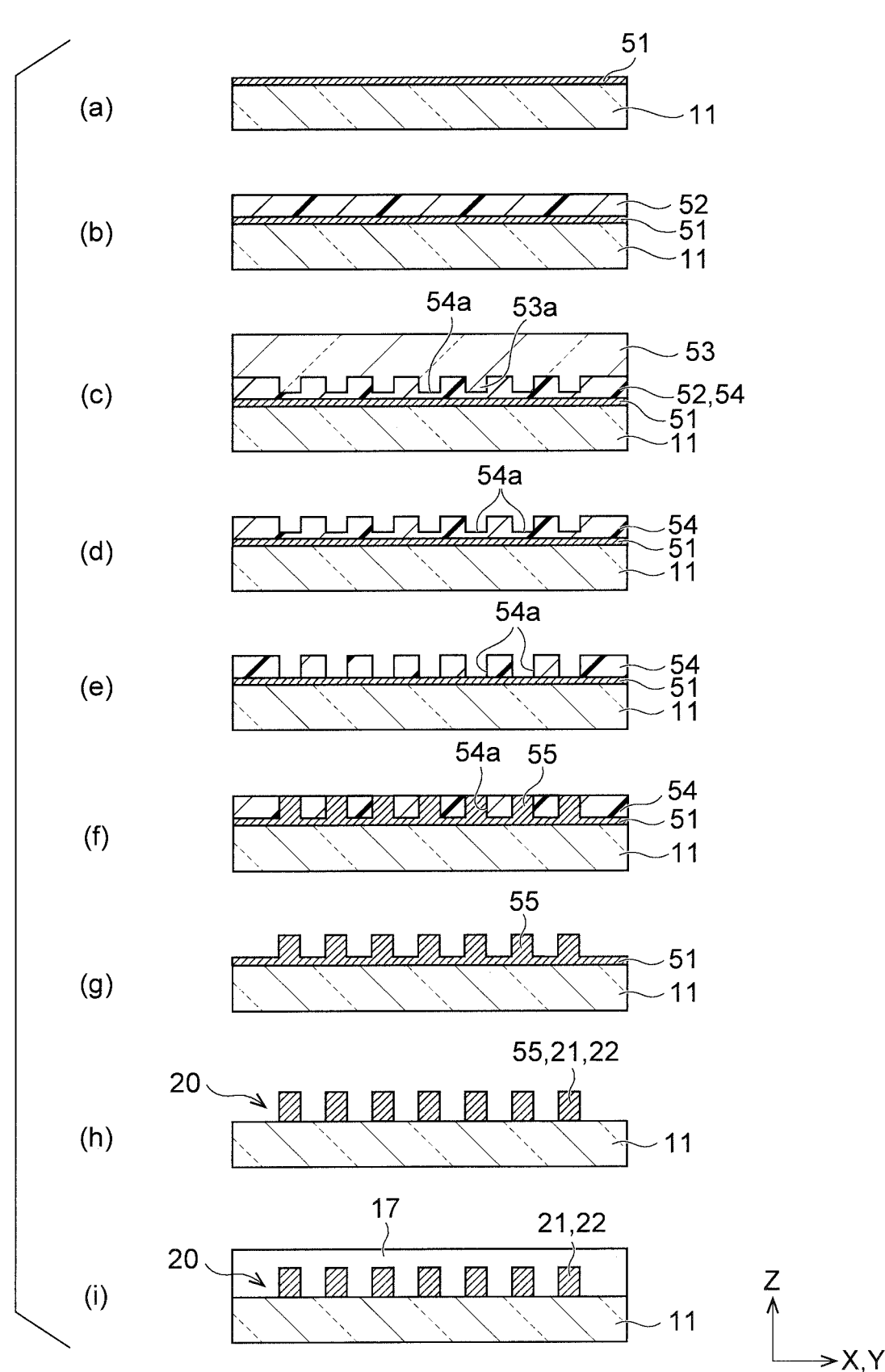
FIGS. 6(a) to 6(i) are sectional views illustrating a method for manufacturing the wiring board according to the first embodiment.

After that, as illustrated in FIG. 6(*i*), the protective layer 17 is formed on the substrate 11 so as to cover the wiring pattern regions 20 and the feeding unit 40. The protective layer 17 may be formed by, for example, roll coating, gravure coating, gravure reverse coating, micro gravure coating, slot die coating, die coating, knife coating, inkjet coating, dispenser coating, kiss coating, spray coating, screen printing, offset printing, or flexographic printing.

Operations of Present Embodiment

The operations of the wiring board having the above-described structure will be described.

Figure 7:
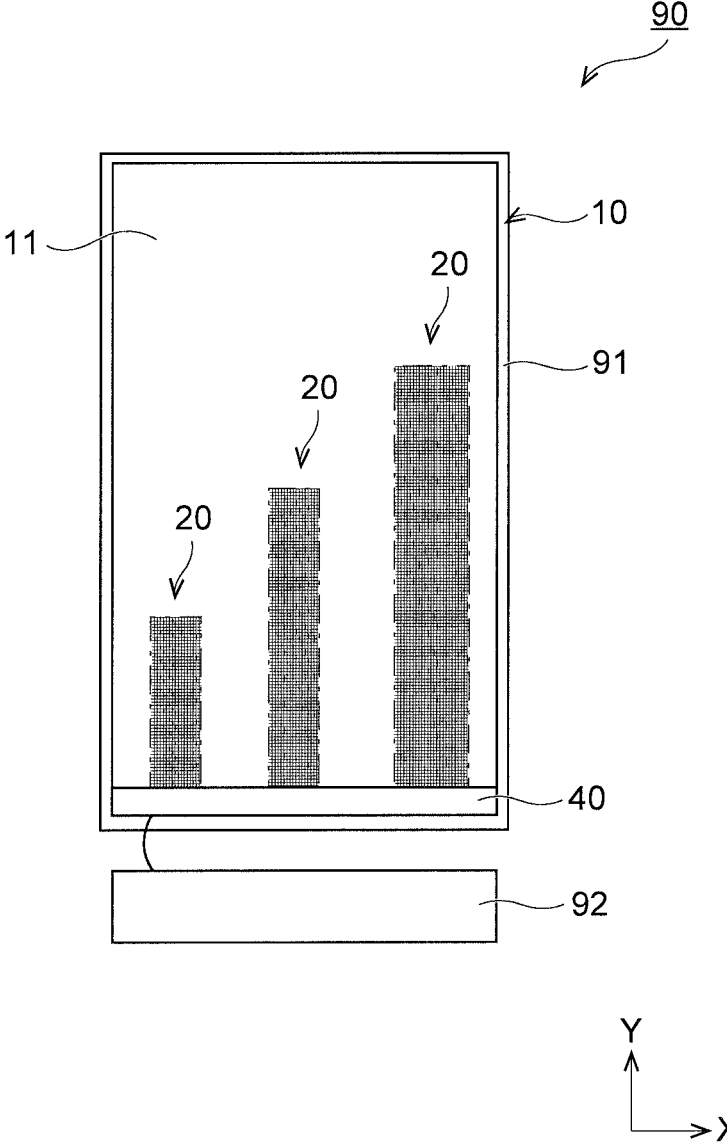
FIG. 7 is a plan view of an image display device according to the first embodiment.

As illustrated in FIG. 7, the wiring board 10 is installed in the image display device 90 having the display 91. The wiring board 10 is disposed on the display 91. The image display device 90 may be, for example, a portable terminal device, such as a smartphone or a tablet. The wiring pattern regions 20 of the wiring board 10 are electrically connected to the wireless communication circuit 92 of the image display device 90 through the feeding unit 40. Thus, radio waves of predetermined frequencies can be transmitted and received through the wiring pattern regions 20. This enables communication using the image display device 90.

In general, the electric current density tends to become high in a wiring pattern region 20 in the vicinity of the feeding unit 40, while radio waves are being transmitted or received using the wiring pattern region 20. Accordingly, the portion of each first-direction wiring line 21 near the feeding unit 40 is more vulnerable to line breakage than the other portion when the wiring board 10 is used over a long period of time. In the present embodiment, however, the line width $W_3$ of the first-direction wiring line 21 in the first region 26 located near the feeding unit 40 is made larger than the line width $W_1$ of the first-direction wiring line 21 in the second region 27, which is the region other than the first region 26. This increases the strength of the portion of the first-direction wiring line 21 near the feeding unit 40 (in the first region 26), which is subjected to high electric current density and vulnerable to line breakage in the long-term use. As a result, the likelihood of the line breakage of each first-direction wiring line 21 can be reduced. Moreover, the portion of the first-direction wiring line 21 near the feeding unit 40 is more vulnerable to line breakage than the other portions also in the process of manufacturing the wiring board 10. By increasing the strength of the portion of each first-direction wiring line 21 near the feeding unit 40 (in the first region 26), the likelihood of line breakage of the first-direction wiring lines 21 can be reduced during the manufacture of the wiring board 10.

In addition, in the present embodiment, the wiring board 10 includes the transparent substrate 11 and wiring pattern regions 20 disposed on the substrate 11, and each wiring pattern region 20 includes the first-direction wiring lines 21.

The transparency of the wiring board 10 is ensured in this configuration. When the wiring board 10 is disposed on the display 91, the display 91 is visible through the openings 23 of each wiring pattern region 20. The visibility of the display 91 is not obstructed by the wiring board 10.

Moreover, in the present embodiment, the wiring pattern region 20 includes the second-direction wiring lines 22 that connect the first-direction wiring lines 21. This can prevent the first-direction wiring lines 21 from breaking easily, which can reduce the likelihood of the first-direction wiring lines 21 malfunctioning.

According to the present embodiment, the first regions 26 in each wiring pattern region 20 are located between the feeding unit 40 and at least the second-direction wiring line 22 positioned closest to the feeding unit 40. Accordingly, the line width $W_3$ of each first-direction wiring line 21 is made large in the vicinity of the connection portion connected to the feeding unit 40, thereby increasing the strength of the first-direction wiring lines 21 and reducing the likelihood of the line breakage. Moreover, this can prevent the region of the first-direction wiring line 21 having the large line width $W_3$ from becoming excessively long, thereby reducing the likelihood of the wiring board 10 decreasing the overall transparency.

Moreover, in the present embodiment, the length $L_4$, which is the length of each first region 26 in the longitudinal direction of the wiring pattern region 20 (in the Y direction), is 0.1 mm or more and 0.5 mm or less. Accordingly, the line width of each first-direction wiring line 21 is made large in the vicinity of the connection portion connected to the feeding unit 40, thereby increasing the strength of the first-direction wiring line 21 and reducing the likelihood of line breakage. Moreover, this can prevent the region of the first-direction wiring line 21 having the large line width $W_3$ from becoming excessively long, thereby reducing the likelihood of the wiring board 10 decreasing the overall transparency.

In the present embodiment, the line width $W_3$ of each first-direction wiring line 21 in the first region 26 is 150% or more of the line width $W_1$ of the first-direction wiring line 21 in the second region 27. Accordingly, the line width of each first-direction wiring line 21 is made large in the vicinity of the connection portion connected to the feeding unit 40, thereby increasing the strength of the first-direction wiring line 21 and reducing the likelihood of line breakage. Moreover, this can prevent the region of the first-direction wiring line 21 having the large line width $W_3$ from becoming excessively long, thereby reducing the likelihood of the wiring board 10 decreasing the overall transparency.

According to the present embodiment, the resistance of each first-direction wiring line 21 in the first region 26 is reduced by increasing the line width $W_3$ of the first-direction wiring line 21 in the first region 26. The resistance (impedance) can be controlled by adjusting the line width $W_3$ of the first-direction wiring line 21 in the first region 26. This can make it easier to perform impedance matching, which becomes important especially in the frequency domain of millimeter wave or microwave or the like. In other words, if the impedance of the first-direction wiring lines 21 is not substantially similar to that of the feeding unit 40, electromagnetic waves may be reflected at the connection portions of the first-direction wiring lines 21 and may not be transmitted appropriately. In the present embodiment, however, the difference in impedance between the first-direction wiring lines 21 and the feeding unit 40 can be reduced by increasing the line width $W_3$ of each first-direction wiring line 21 at the connection portion between the first-direction wiring line 21 and the feeding unit 40.

Figure 8:
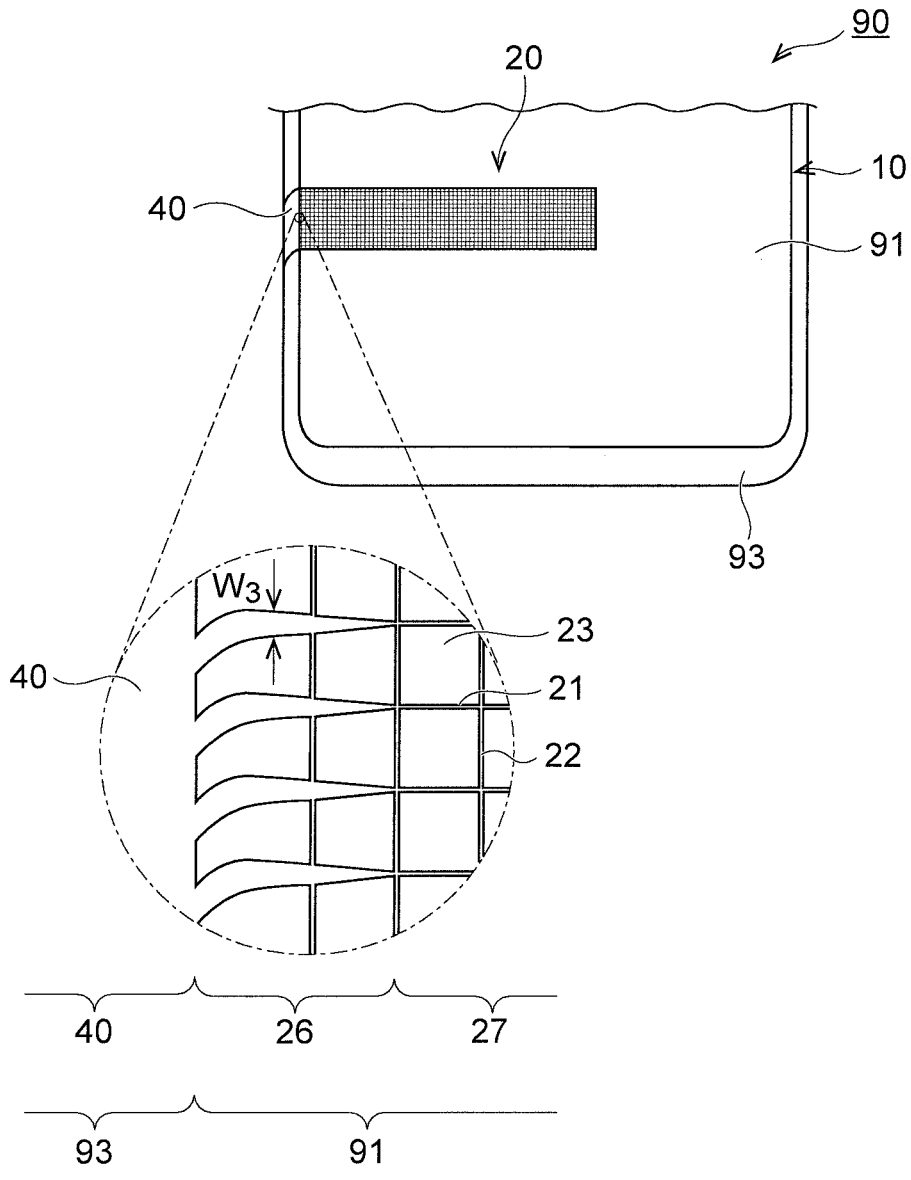
FIG. 8 is a partially enlarged plan view of an image display device according to a modification of the first embodiment.

Moreover, in the present embodiment, the increased line width $W_3$ of each first-direction wiring line 21 in the first region 26 can improve the durability of the first-direction wiring lines 21 against bending. For example, as illustrated in FIG. 8, when the feeding unit 40 is disposed at an edge of the display 91, the first-direction wiring lines 21 may be bent at the first regions 26. In the present embodiment, however, each first-direction wiring line 21 has the increased line width $W_3$ at first region 26, which reduces the likelihood of line breakage when the first-direction wiring lines 21 are bent.

Moreover, as illustrated in FIG. 8, the wiring pattern region 20 is disposed on the display 91. The feeding unit 40 is disposed on, or bent at, a bezel (frame) 93 that surrounds the display 91. The opening ratio of the feeding unit 40 is 0% as opposed to the opening ratio of the wiring pattern region 20, which is, for example, 87% or more and less than 100%. According to the present embodiment, the increased line width $W_3$ of each first-direction wiring line 21 in the first region 26 can moderate an abrupt change in opening ratio between the wiring pattern region 20 and the feeding unit 40, which can contribute to reducing visibility of the wiring pattern region 20.

Modifications of First Embodiment

Next, modifications of the wiring board according to the present embodiment will be described with reference to FIGS. 9 to 14. FIGS. 9 to 14 are views illustrating various modifications of the wiring board. In the modifications illustrated in FIGS. 9 to 14, the structure of the wiring pattern region 20 is different from that described in the embodiment in relation to FIGS. 1 to 7, and other configurations are substantially the same. In FIGS. 9 to 14, the same components as those illustrated in FIGS. 1 to 7 are denoted by the same reference signs, and detailed descriptions thereof will be omitted.

Modification 1 of First Embodiment

Figure 9:
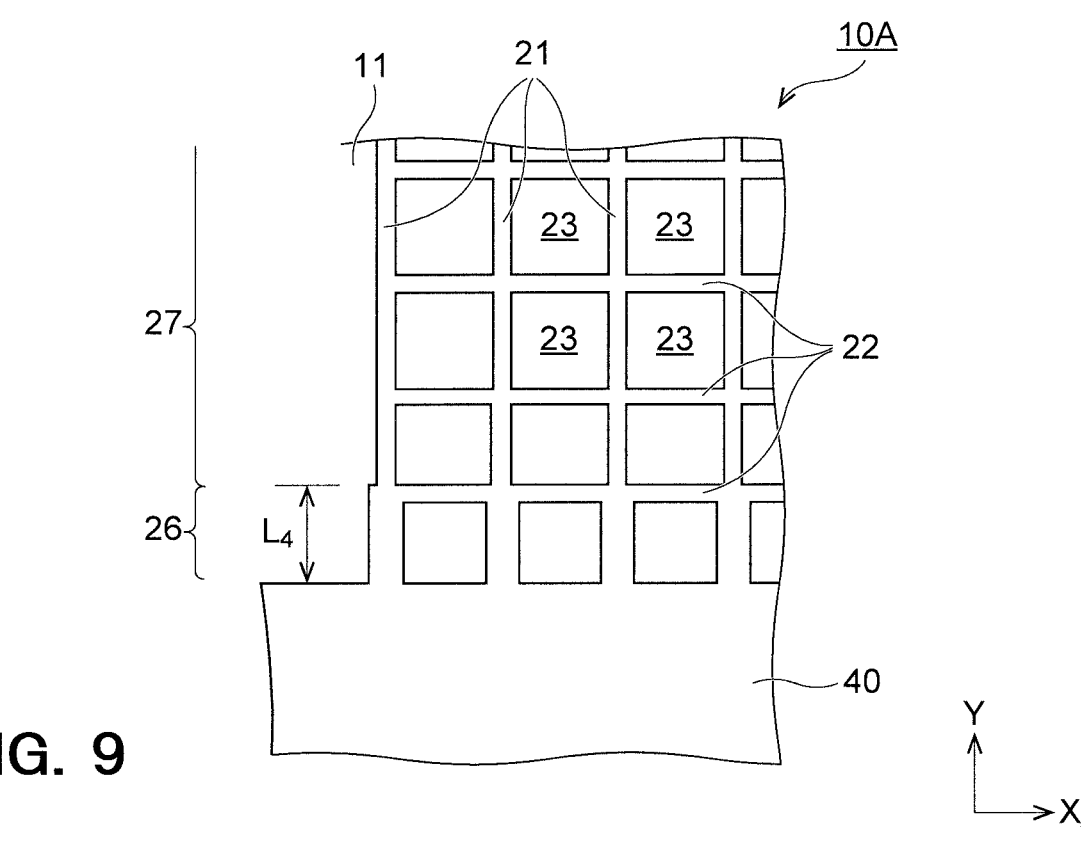
FIG. 9 is an enlarged plan view of a wiring board according to Modification 1 of the first embodiment.

FIG. 9 illustrates a wiring board 10A according to Modification 1 of the present embodiment. In FIG. 9, the first region 26 of the first-direction wiring line 21 is present only between the feeding unit 40 and the second-direction wiring line 22 positioned closest to the feeding unit 40 (positioned furthest toward the negative side in the Y direction). This can minimize deterioration of the overall transparency of the wiring board 10 while reducing the likelihood of line breakage of the first-direction wiring line 21.

Modification 2 of First Embodiment

Figure 10:
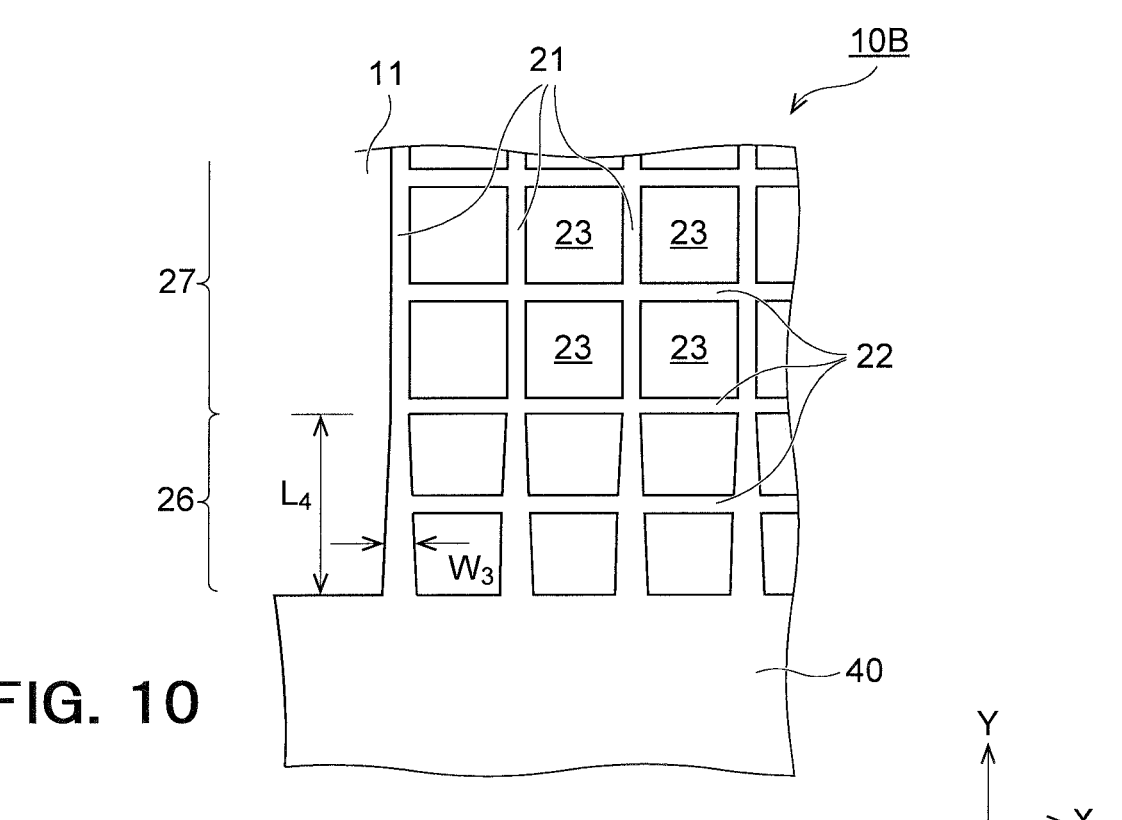
FIG. 10 is an enlarged plan view of a wiring board according to Modification 2 of the first embodiment.

FIG. 10 illustrates a wiring board 10B according to Modification 2 of the present embodiment. In FIG. 10, the line width $W_3$ in the first region 26 is not uniform along each first-direction wiring line 21 in the longitudinal direction (Y direction). In other words, the line width $W_3$ in the first region 26 is largest near the feeding unit 40 and smallest near the second region 27. In this case, the shape of the first-direction wiring line 21 in the first region 26 in plan view is such that the line width $W_3$ becomes gradually small as the distance from the feeding unit 40 becomes large. In FIG. 10, the shape of the first-direction wiring line 21 in the first region 26 is trapezoidal or triangular in plan view, and both sides of the first-direction wiring line 21 in the first region 26 are shaped like straight lines. The shape of the first-direction wiring line 21 in the first region 26 is not limited to this but may be such that both sides of the first-direction wiring line 21 are curved. The structure illustrated in FIG. 10 can improve the strength of the connection portion that is connected to the feeding unit 40 and where the electric current density is higher in the first region 26. Moreover, this structure can reduce deterioration of the overall transparency of the wiring board 10 while reducing the likelihood of line breakage of each first-direction wiring line 21 at the connection portion connected to the feeding unit 40. In addition, the line width $W_3$ of the first-direction wiring line 21 gradually increases at the connection portion between the first-direction wiring line 21 and the feeding unit 40, which can make it easier to perform the above-described impedance matching between the first-direction wiring lines 21 and the feeding unit 40.

Modification 3 of First Embodiment

Figure 11:
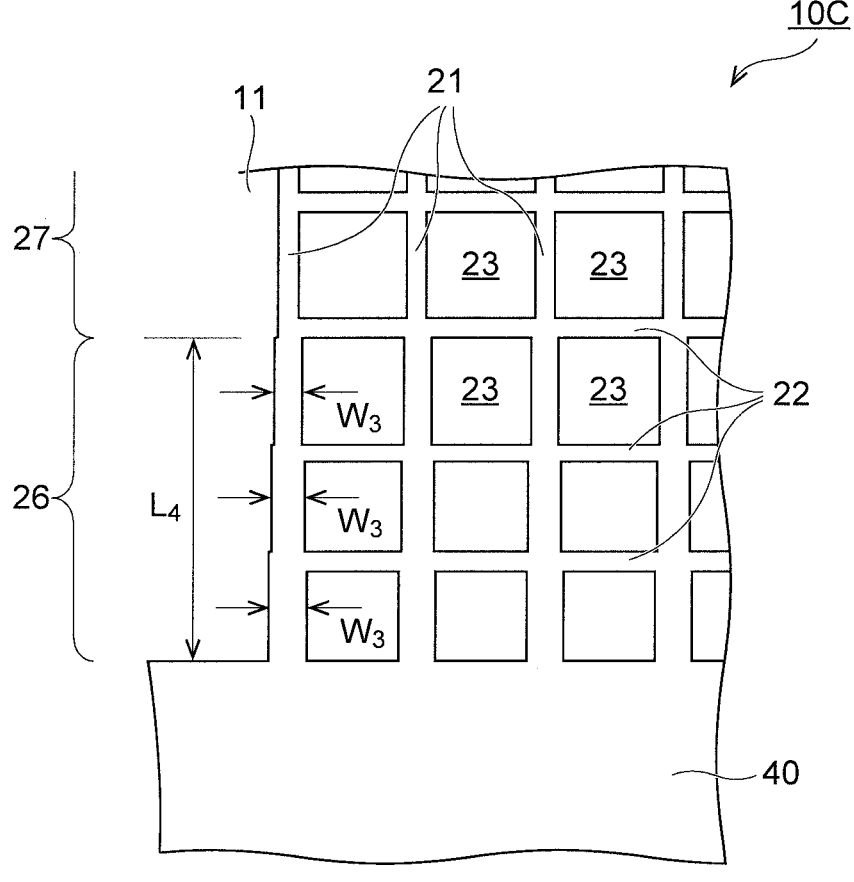
FIG. 11 is an enlarged plan view of a wiring board according to Modification 3 of the first embodiment.

FIG. 11 illustrates a wiring board 10C according to Modification 3 of the present embodiment. In FIG. 11, the line width $W_3$ in the first region 26 is not uniform along each first-direction wiring line 21 in the longitudinal direction (Y direction). In other words, the line width $W_3$ in the first region 26 is largest near the feeding unit 40 and smallest near the second region 27. In this case, the line width $W_3$ in the first region 26 becomes smaller stepwise from the vicinity of the feeding unit 40 to the vicinity of the second region 27. In other words, the line width $W_3$ is largest at the position between the feeding unit 40 and the second-direction wiring line 22 closest to the feeding unit 40. The line width $W_3$ is second largest at the position between the second-direction wiring line 22 closest to the feeding unit 40 and the second-direction wiring line 22 second closest to the feeding unit 40. The line width $W_3$ is third largest at the position between the second-direction wiring line 22 second closest to the feeding unit 40 and the second-direction wiring line 22 third closest to the feeding unit 40. The line width $W_3$ in the first region 26 is not limited to this but may become smaller in two steps or in four or more steps from the vicinity of the feeding unit 40 to the vicinity of the second region 27. The structure illustrated in FIG. 11 can improve the strength of the connection portion that is connected to the feeding unit 40 and where the electric current density is higher in the first region 26. Moreover, the structure can reduce deterioration of the overall transparency of the wiring board 10 while reducing the likelihood of line breakage of each first-direction wiring line 21 at the connection portion connected to the feeding unit 40.

Modification 4 of First Embodiment

Figure 12:
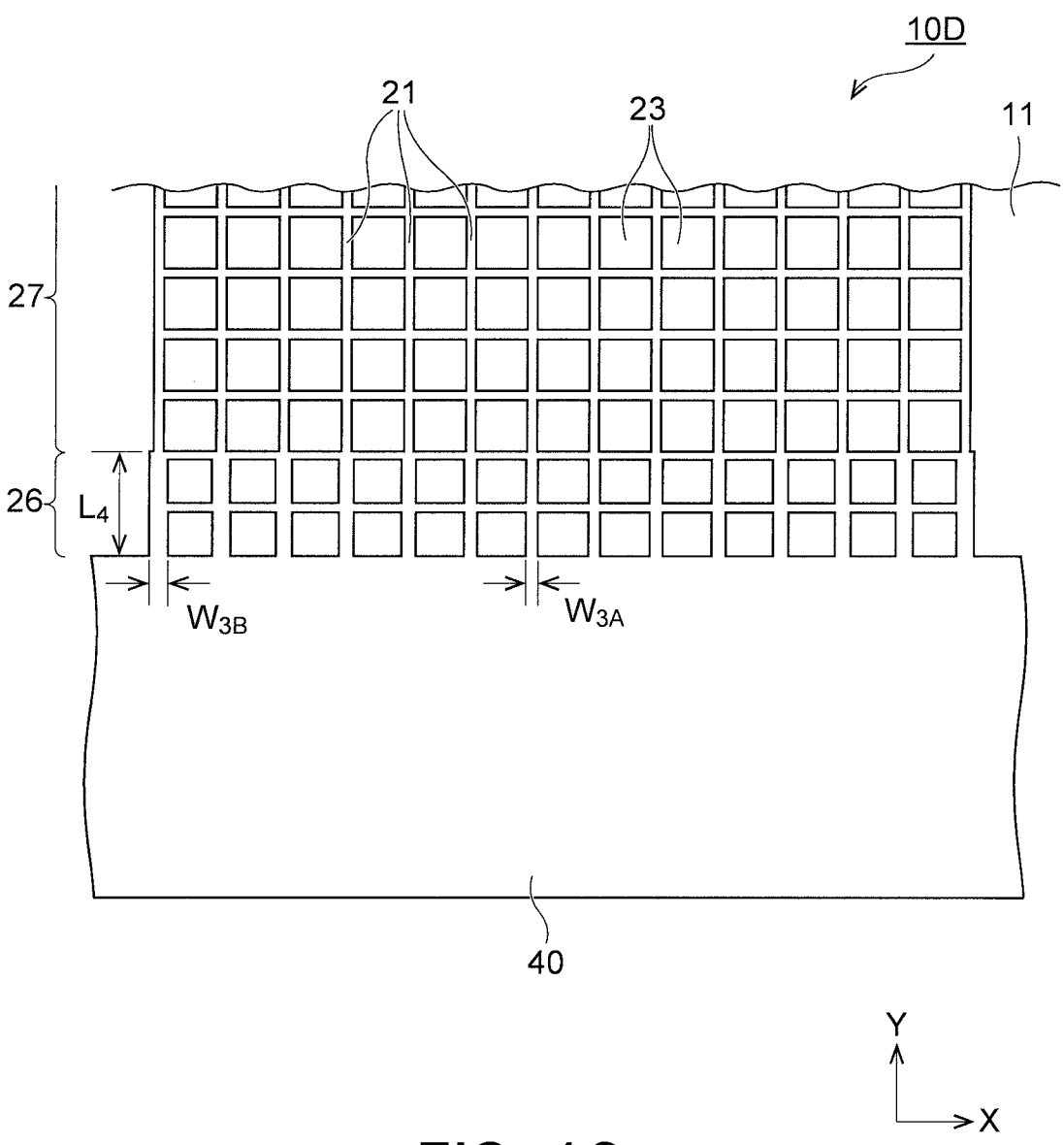
FIG. 12 is an enlarged plan view of a wiring board according to Modification 4 of the first embodiment.

FIG. 12 illustrates a wiring board 10D according to Modification 4 of the present embodiment. In FIG. 12, a line width $W_{3A}$ of a first-direction wiring line 21 in the first region 26 positioned near the center of the wiring pattern region 20 in the width direction (X direction) is smaller than a line width $W_{3B}$ of a first-direction wiring line 21 in the first region 26 positioned near an edge of the wiring pattern region 20 in the width direction (X direction). The line widths of the first-direction wiring lines 21 in the first regions 26 are configured such that the line width becomes large gradually from the first-direction wiring line 21 positioned near the widthwise center to the first-direction wiring lines 21 positioned near the widthwise edges.

In general, while radio waves are being transmitted or received using a wiring pattern region 20, the electric current flowing in the wiring pattern region 20 does not become uniform in the width direction (X direction). More specifically, the electric current flowing in the widthwise edge portions of the wiring pattern region 20 is larger than that flowing in the widthwise center portion of the wiring pattern region 20. In the structure illustrated in FIG. 12, however, the line width $W_{3A}$ in the widthwise center portion of the wiring pattern region 20 is set to be smaller than the line width $W_{3B}$ in the widthwise edge portions of the wiring pattern region 20 ($W_{3A} < W_{3B}$). In other words, the density of the first-direction wiring lines 21 in the widthwise edge portions where the electric current value is high is set to be greater than that in the widthwise center portion where the electric current value is low. This can make the current distribution uniform between the widthwise center portion and the widthwise edge portions of the wiring pattern region 20 compared with the case of the wiring pattern region 20 having a uniform mesh, which can improve characteristics (such as antenna characteristics) of the wiring pattern region 20.

Modification 5 of First Embodiment

Figure 13:
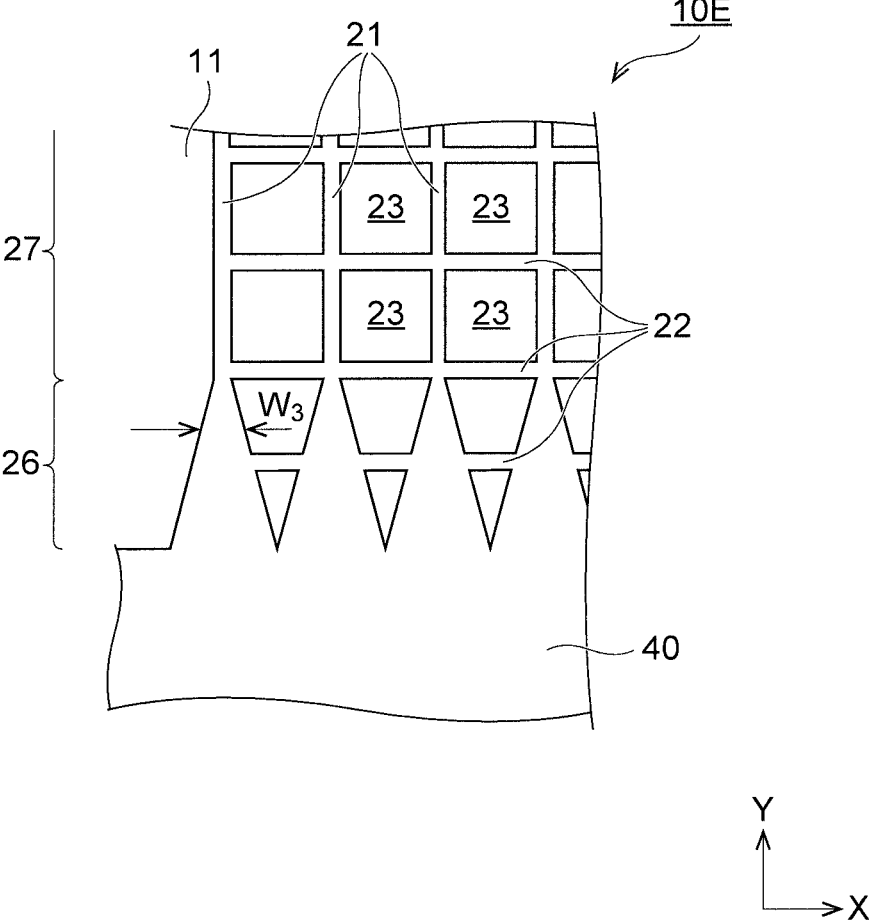
FIG. 13 is an enlarged plan view of a wiring board according to Modification 5 of the first embodiment.

FIG. 13 illustrates a wiring board 10E according to Modification 5 of the present embodiment. In FIG. 13, the line width $W_3$ in the first region 26 is not uniform along each first-direction wiring line 21 in the longitudinal direction (Y direction). In other words, the line width $W_3$ in the first region 26 is largest near the feeding unit 40 and smallest near the second region 27. In this case, the shape of the first-direction wiring line 21 in the first region 26 in plan view is such that the line width $W_3$ becomes gradually small as the distance from the feeding unit 40 becomes large. In FIG. 13, the shape of the first-direction wiring line 21 in the first region 26 is trapezoidal or triangular in plan view, and the trapezoidal or triangular shapes of adjacent first-direction wiring lines 21 in the X direction are joined to each other. This enables each first-direction wiring line 21 to be connected smoothly to the feeding unit 40, which can make it easier to perform the above-described impedance matching between the first-direction wiring line 21 and the feeding unit 40. This also can moderate an abrupt change in opening ratio between the wiring pattern region 20 and the feeding unit 40, which can render the wiring pattern region 20 not readily visible.

Modification 6 of First Embodiment

Figure 14:
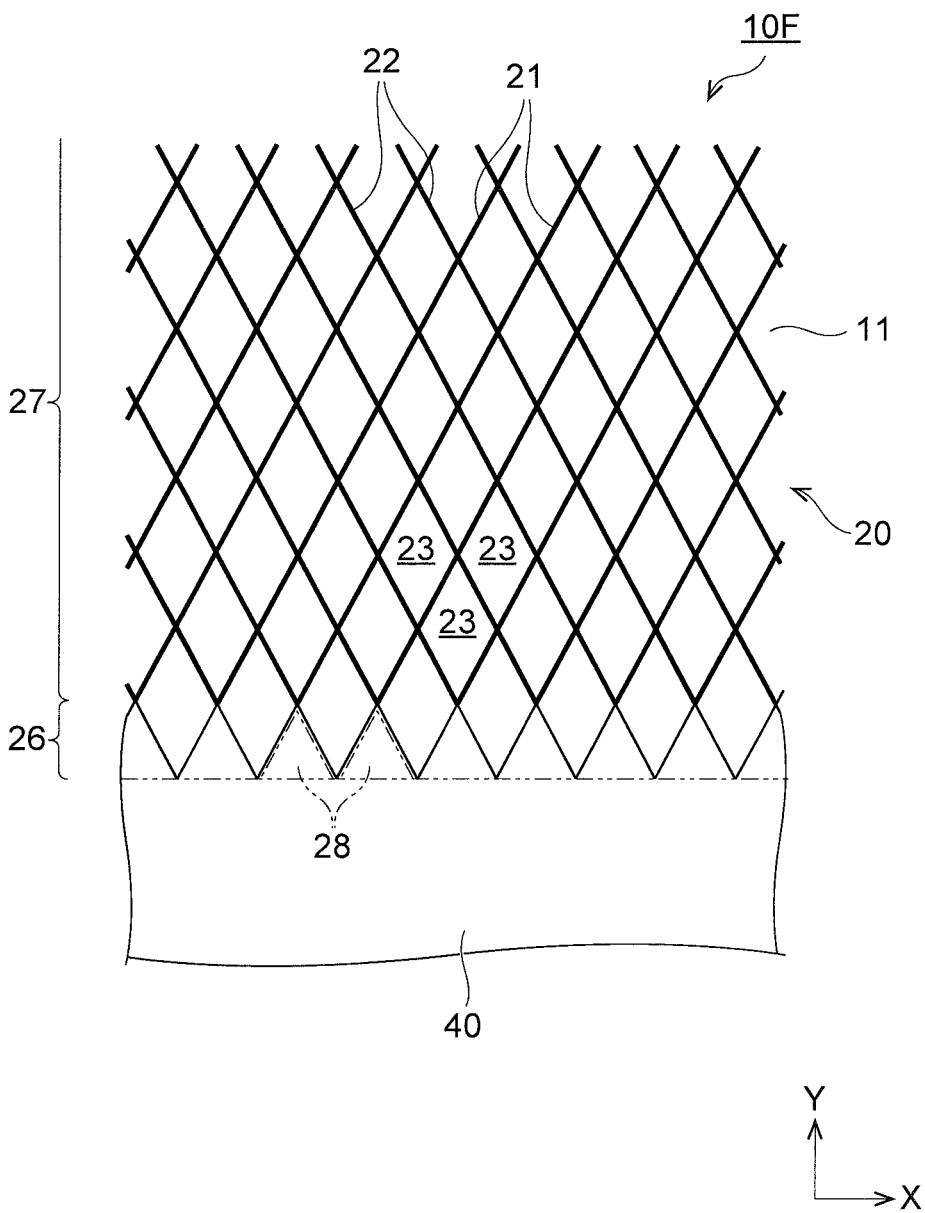
FIG. 14 is an enlarged plan view of a wiring board according to Modification 6 of the first embodiment.

FIG. 14 is an enlarged plan view of a wiring board 10F according to Modification 6 of the present embodiment. As illustrated in FIG. 14, the first-direction wiring lines 21 obliquely intersect the second-direction wiring lines 22, and the openings 23 are formed so as to have rhombus shapes in plan view. The first-direction wiring lines 21 and the second-direction wiring lines 22 are not parallel to any of the X direction and the Y direction. Regions 28 are formed at positions adjacent to the feeding unit 40. The regions 28 are surrounded by the feeding unit 40, respective first-direction wiring lines 21, and respective second-direction wiring lines 22 and are formed as non-openings. The regions 28 are shaped triangularly in plan view. In other words, the regions 28 are filled with the metal that forms the first-direction wiring lines 21, the second-direction wiring lines 22, and the feeding unit 40. The substrate 11 is not exposed at the regions 28. The portions of the first-direction wiring lines 21 and the second-direction wiring lines 22 near the feeding unit 40 (at the first regions 26) are subjected to high electric current density and vulnerable to line breakage in the long-term use. With this configuration, however, the strength of the portions of the first-direction wiring lines 21 and the second-direction wiring lines 22 can be increased, which can reduce the likelihood of line breakage.

All of the regions 28 surrounded by the feeding unit 40, the first-direction wiring lines 21, and the second-direction wiring lines 22 may be formed as non-openings, or alternatively some of the regions 28 may be formed as non-openings. In the latter case, some regions 28 located near the center of the wiring pattern region 20 in the width direction (X direction) may be formed as openings, whereas some regions 28 located near the edges of the wiring pattern region 20 in the width direction (X direction) may be formed as non-openings. This can increase, as described above, the density of metal portions at the widthwise edges of the wiring pattern region 20 where the electric current value is high compared with the density of metal portions at the widthwise center of the wiring pattern region 20 where the electric current value is low. This can make the current distribution uniform between the widthwise center portion and the widthwise edge portions of the wiring pattern region 20, which can improve characteristics (such as antenna characteristics) of the wiring pattern region 20.

Although the wiring pattern regions 20 function as antennas in the examples described above with reference to FIGS. 1 to 14, the wiring pattern regions 20 are not limited to this. The wiring pattern regions 20 may instead have functions of, for example, hovering (function for enabling a user to operate without touching a display), fingerprint authentication, heating, or noise filtering (shielding). Also in such cases, the likelihood of line breakage of the first-direction wiring lines 21 can be reduced without decreasing the transparency of the wiring board 10 by setting the line width $W_3$ of each first-direction wiring line 21 in the first region 26 to be larger than the line width $W_1$ thereof in the second region 27.

Second Embodiment

Figure 15:
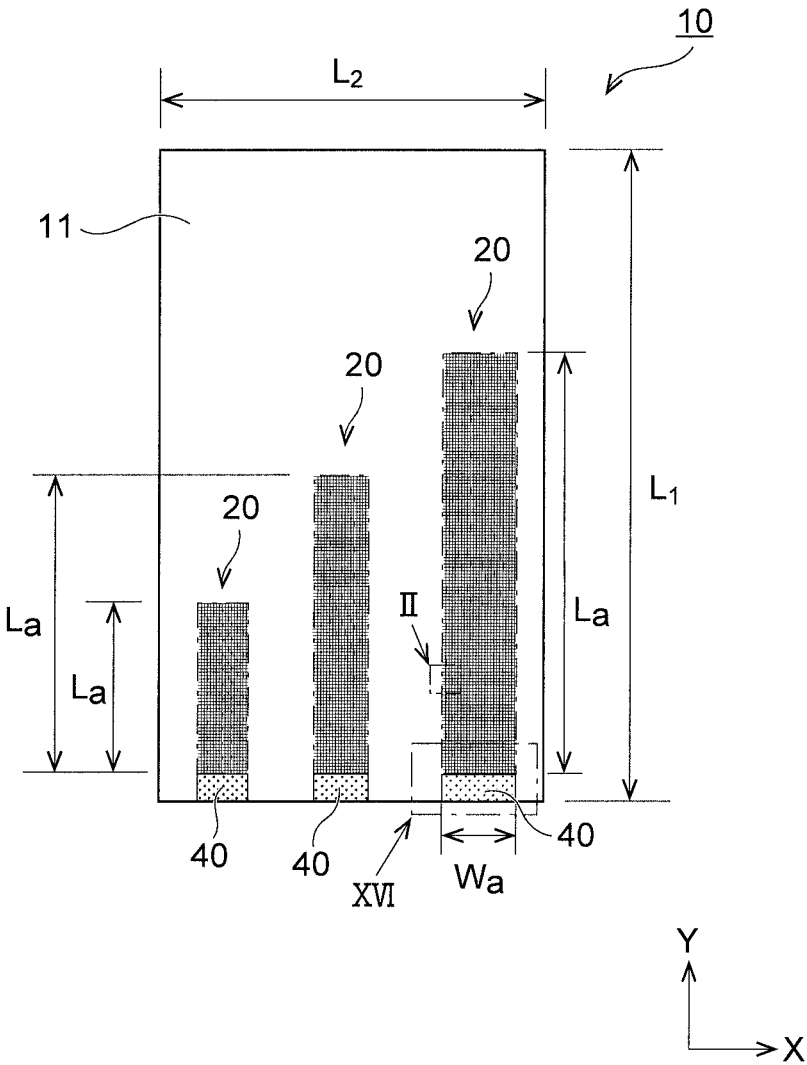
FIG. 15 is a plan view of a wiring board according to a second embodiment.
Figure 16:
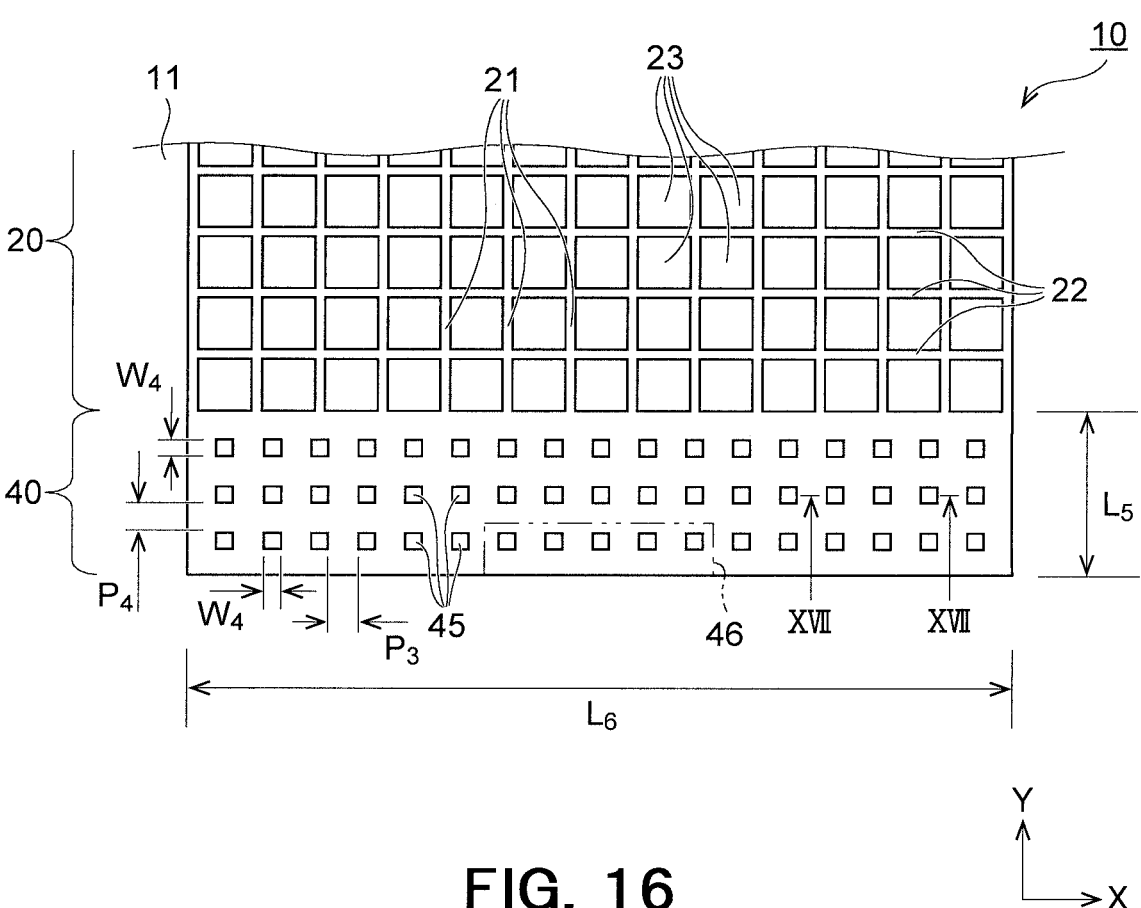
FIG. 16 is an enlarged plan view of the wiring board according to the second embodiment (enlarged view of region XVI in FIG. 15).
Figure 17:
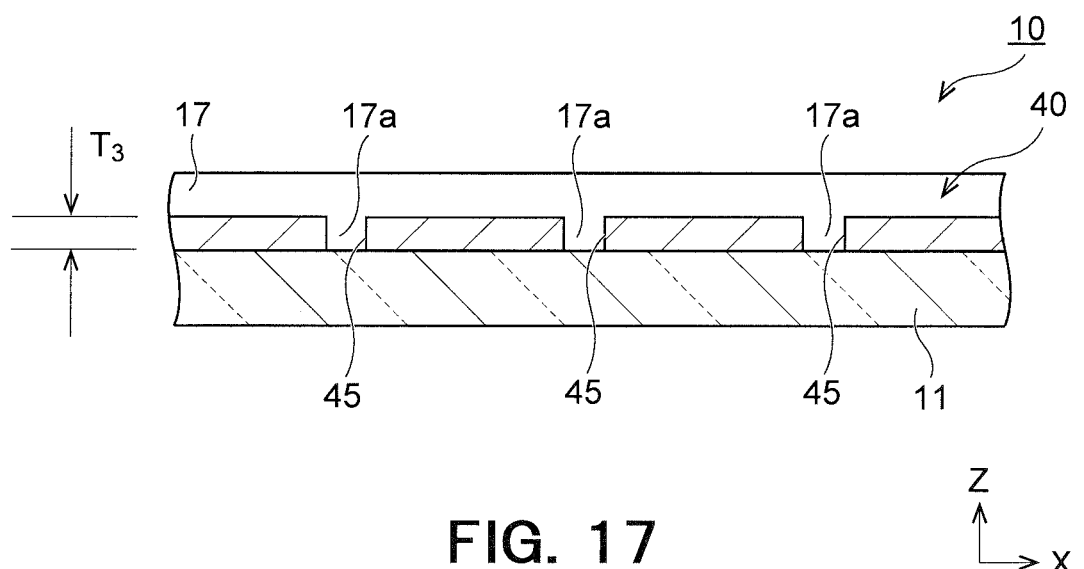
FIG. 17 is a sectional view of a feeding unit of the wiring board according to the second embodiment (sectional view of line XVII-XVII in FIG. 16).

Next, a second embodiment will be described with reference to FIGS. 15 to 18. FIGS. 15 to 18 are views illustrating the second embodiment. In the second embodiment illustrated in FIGS. 15 to 18, the structure of the feeding unit 40 is mainly different from that described in the first embodiment in relation to FIGS. 1 to 14, and other configurations are substantially the same. In FIGS. 15 to 18, the same components as those illustrated in FIGS. 1 to 14 are denoted by the same reference signs, and detailed descriptions thereof will be omitted. The following description focuses on the differences from the first embodiment.
[Structure of Wiring Board]
The structure of a wiring board according to the present embodiment will be described with reference to FIGS. 15 to 17. FIGS. 15 to 17 are views illustrating the wiring board according to the present embodiment.

As illustrated in FIG. 15, a wiring board 10 according to the present embodiment is disposed on, for example, a display of an image display device. The wiring board 10 includes a transparent substrate 11 and wiring pattern regions 20 disposed on the substrate 11. The wiring pattern regions 20 are electrically connected to respective feeding units 40.

In the present embodiment, each first-direction wiring line 21 may have a uniform width over its entire length, which is different from the first embodiment. The openings 23 may each have substantially an equal area in the wiring pattern region 20. This eliminates the size variation of the openings 23 within the wiring pattern region 20 and can render the wiring pattern region 20 not readily visible. It is preferable that the openings 23 have the same shape and size within the wiring pattern region 20. The openings 23, however, may have different shapes and sizes depending on locations.

The sectional shape of each first-direction wiring line 21 is substantially uniform entirely along the first-direction wiring line 21 in the longitudinal direction (Y direction). In addition, the sectional shape of each second-direction wiring line 22 is substantially uniform entirely along the second-direction wiring line 22 in the longitudinal direction (X direction). However, the line width of the first-direction wiring line 21 is not limited to this. Also in the present embodiment, as is the case for the first embodiment, the line width of each first-direction wiring line 21 may be made larger in the first region 26 near the feeding unit 40 than the line width of the first-direction wiring line 21 in the second region 27. Moreover, the other configurations of the wiring pattern region 20 may be the same as those in the first embodiment.

Referring to FIG. 15, the feeding units 40 are electrically connected to respective wiring pattern regions 20. Each feeding unit 40 is formed of a substantially rectangular thin-plate-shaped conductive member. The longitudinal direction of each feeding unit 40 is parallel to the X direction, and the transverse direction of the feeding unit 40 is parallel to the Y direction. The feeding unit 40 is disposed at an end of the substrate 11 in the longitudinal direction of the substrate 11 (an end at the negative side in the Y direction). Examples of the material of the feeding unit 40 include metal materials (including alloys), such as gold, silver, copper, platinum, tin, aluminum, iron, and nickel. The feeding unit 40 is electrically connected to a wireless communication circuit 92 of an image display device 90 (see FIG. 18) through a feeder line 95 when the wiring board 10 is installed in the image display device 90. Although the feeding unit 40 is provided on the front surface of the substrate 11, the provision of the feeding unit 40 is not limited to this. The feeding unit 40 may have a portion or its entirety positioned outside the peripheral edge of the substrate 11. Although the wiring pattern regions 20 are connected to respective feeding units 40 in FIG. 15, the wiring pattern regions 20 may be electrically connected to a single feeding unit 40.

As illustrated in FIG. 16, the feeding unit 40 is electrically connected to the portions of the first-direction wiring lines 21 that face the negative side in the Y direction. In this case, the feeding unit 40 is integrally formed with the corresponding wiring pattern region 20. A connection region 46 is formed in the feeding unit 40 at a position opposite to the wiring pattern region 20 (at a position at the negative side in the Y direction). The connection region 46 is electrically connected to a feeder line 95, which will be described later. A length $L_6$, which is the length of the feeding unit 40 in the longitudinal direction (X direction), may be 1 mm or more and 10 mm or less. A length $L_5$, which is the length of the feeding unit 40 in the transverse direction (Y direction), may be 0.5 mm or more and 3 mm or less. A thickness $T_3$ of the feeding unit 40 (see FIG. 17) may be the same as the height $H_1$ of the first-direction wiring line 21 (see FIG. 3) and also the same as the height $H_2$ of the second-direction wiring line 22 (see FIG. 4). For example, the thickness $T_3$ may be set in the range of 0.1 μm to 5.0 μm.

In the present embodiment, the feeding unit 40 has multiple through holes 45. In plan view, the through holes 45 are disposed at lattice points on the feeding unit 40. In other words, the through holes 45 are disposed in rows and columns on the surface of the feeding unit 40. In other words, the through holes 45 are arranged side by side in the X direction and also side by side in the Y direction. The through holes 45 extend through the feeding unit 40 in the thickness direction (Z direction), and the transparent substrate 11 is exposed at each through hole 45. In this case, the through holes 45 are disposed substantially over the entire surface of the feeding unit 40, but the disposition of the through holes 45 is not limited to this. It is preferable that the through holes 45 be at least disposed in a region to be covered with the protective layer 17 and also in the connection region 46. This can improve the adhesion between the feeding unit 40 and the protective layer 17 and also can improve the adhesion between the feeding unit 40 and solder used to connect to a feeder line 95.

Each through hole 45 has a square shape in plan view. A width $W_4$, which is the width (length of one side) of each through hole 45, may be 50 μm or more and 500 μm or less. The shape of the through hole 45 in plan view is not limited to this but may be, for example, a circular shape, an elliptical shape, or a polygonal shape such as a rectangle. The through holes 45 are arranged at equal intervals in the X direction and also in the Y direction. More specifically, a pitch $P_3$ of the through holes 45 in the X direction may be set at, for example, 100 μm or more and 500 μm or less, and a pitch $P_4$ of the through holes 45 in the Y direction may be set at, for example, 100 μm or more and 500 μm or less. The arrangement of the through holes 45 is not limited to this. The through holes 45 may be arranged at equal intervals either in the X direction or in the Y direction. In the present embodiment, the pitch $P_3$ of the through holes 45 in the X direction is equal to the pitch $P_4$ of the through holes 45 in the Y direction ($P_3=P_4$). The pitch $P_3$ and the pitch $P_4$, however, may be different from each other.

Moreover, as illustrated in FIG. 17, the protective layer 17 is formed on the front surface of the substrate 11 so as to cover the wiring pattern regions 20 and the feeding units 40. The protective layer 17, which is provided to protect the wiring pattern regions 20 and the feeding units 40, may be formed substantially over the entire front surface of the substrate 11. Alternatively, the protective layer 17 may be formed in the same manner as in the first embodiment.

As illustrated in FIG. 17, the protective layer 17 has protrusions 17a that protrude toward the substrate 11. The protrusions 17a are shaped by transferring the shapes of the through holes 45 of the feeding unit 40. The tip ends of the protrusions 17a (ends at the negative side in the Z direction) are in contact with the front surface of the substrate 11. The protrusions 17a of the protective layer 17 enter the through holes 45 of the feeding unit 40 and are hardened in the through holes 45. The protrusions 17a serve as anchors. This causes the protective layer 17 to adhere strongly to the feeding unit 40, which reduces the likelihood of the protective layer 17 being separated from the feeding unit 40. The protective layer 17 may be formed so as not to cover the connection region 46 of the feeding unit 40, which makes it easier to connect the feeder line 95 to the feeding unit 40.

[Method for Manufacturing Wiring Board]

The wiring board of the present embodiment can be manufactured substantially in the same manner as the case of the first embodiment (FIGS. 6(a) to 6(i)). Note that in the present embodiment, the feeding unit 40 having the through holes 45 may be formed as a portion of the conductor 55 when the conductive layer 51 is removed from the front surface of the substrate 11 (see FIG. 6(*h*)). Alternatively, a flat plate-shaped feeding unit 40 having the through holes 45 may be separately prepared, and the thus-prepared feeding unit 40 may be electrically connected to the wiring pattern region 20. When the protective layer 17 is subsequently formed so as to cover the wiring pattern regions 20 and the feeding units 40 on the substrate 11 (see FIG. 6(*i*)), a portion of the protective layer 17 enters the through holes 45 and subsequently hardens. As a result, the protrusions 17*a* are formed and joined firmly to the feeding units 40 (see FIG. 17).

Operations of Present Embodiment

The operations of the wiring board having the above-described structure will be described.

Figure 18:
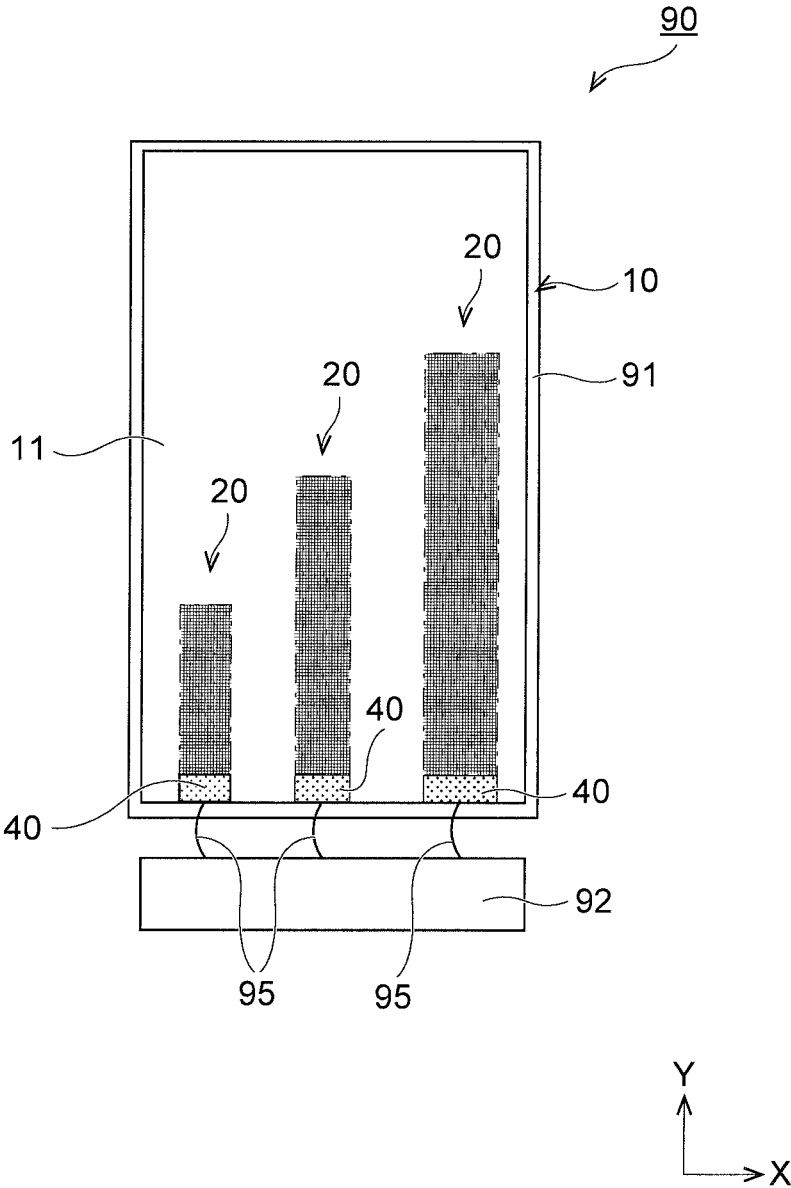
FIG. 18 is a plan view of an image display device according to the second embodiment.
Figure 19:
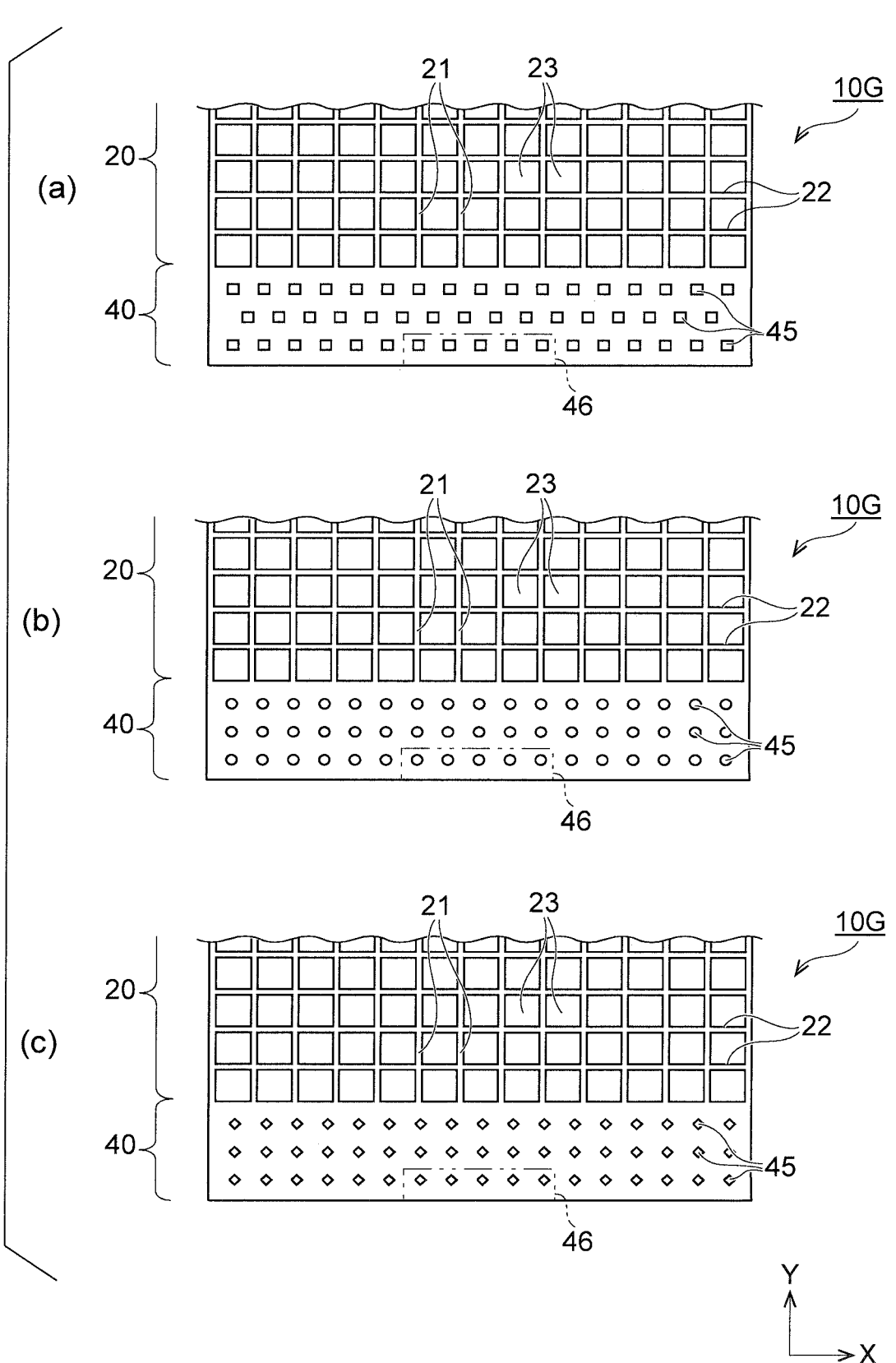
FIGS. 19(a) to 19(c) are enlarged plan views of a wiring board according to Modification 1 of the second embodiment.
Figure 20:
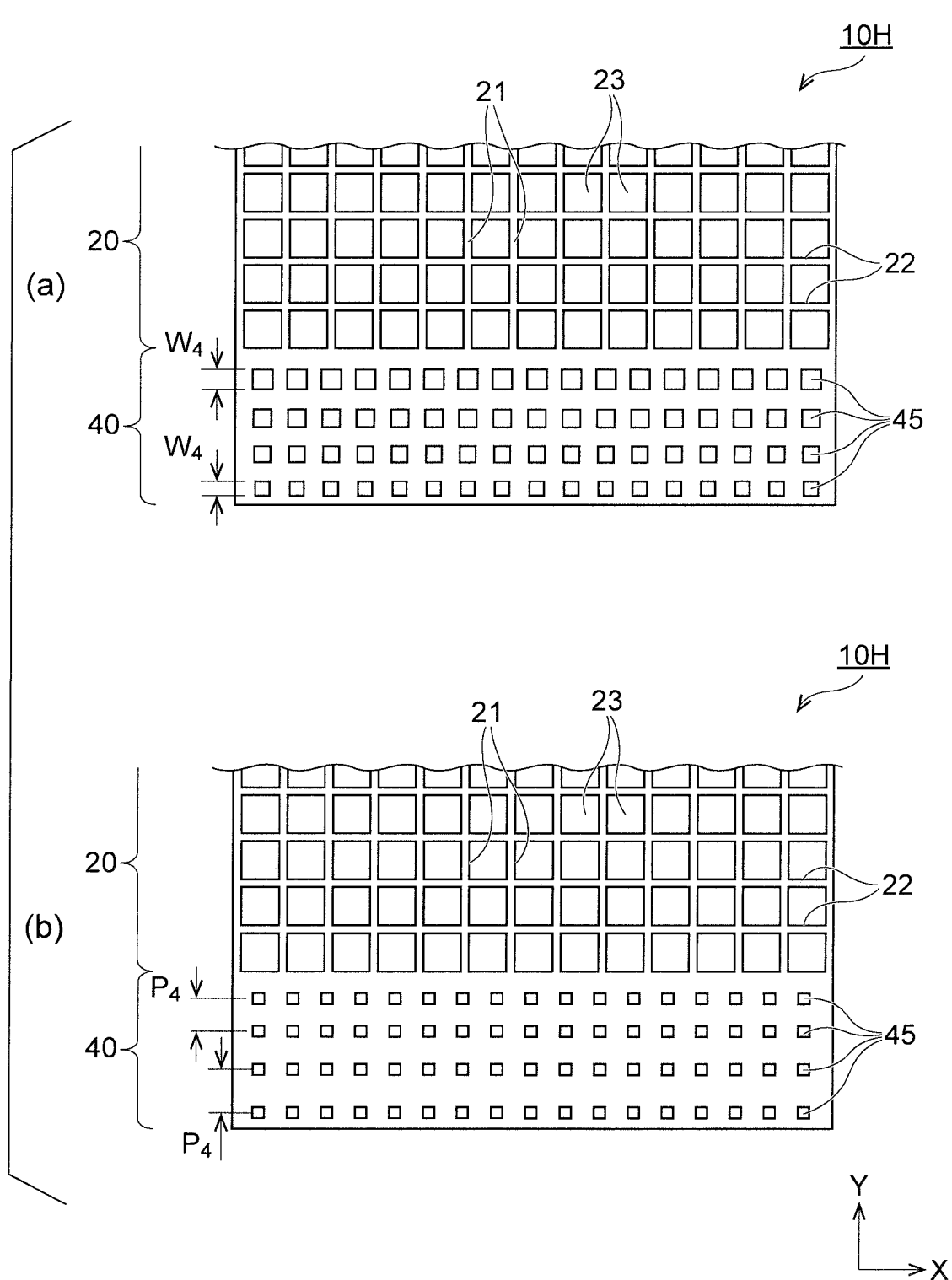
FIGS. 20(a) and 20(b) are enlarged plan views of a wiring board according to Modification 2 of the second embodiment.

As illustrated in FIG. 18, the wiring board 10 is installed in the image display device 90 having the display 91. The wiring board 10 is disposed on the display 91. The image display device 90 may be, for example, a portable terminal device, such as a smartphone or a tablet. The wiring pattern regions 20 of the wiring board 10 are electrically connected to the wireless communication circuit 92 of the image display device 90 through the feeding units 40 and the feeder lines 95. Thus, radio waves of predetermined frequencies can be transmitted and received through the wiring pattern regions 20. This enables communication using the image display device 90.

In general, each feeding unit 40 is in contact with the protective layer 17 in a wider area compared with the first-direction wiring lines 21 and the second-direction wiring lines 22. The metal-made feeding unit 40, however, is not always adhered strongly to the resin-made protective layer 17 due to difference in material. Accordingly, if, for example, an external force is applied to the wiring board 10 in a direction of bending the wiring board 10 when the image display device 90 is used, the protective layer 17 may be separated from the feeding unit 40, which may lead to separation of the protective layer 17 entirely from the substrate 11.

According to the present embodiment, however, the feeding unit 40 has the through holes 45 at the surface, and portions (protrusions 17*a*) of the protective layer 17 enter the through holes 45 and form anchors that are joined strongly to the feeding unit 40. This reduces the likelihood of the protective layer 17 being separated from the feeding unit 40.

In addition, according to the present embodiment, solder for fixing the feeder line 95 to the feeding unit 40 can also enter some through holes 45 of the feeding unit 40. Portions of the solder in the through holes 45 serve as anchors and are joined to the feeding unit 40. This enables the feeder line 95 to adhere strongly to the feeding unit 40. The through holes 45 formed in the feeding unit 40 can prevent the solder from flowing excessively and spreading wider than necessary.

In addition, in the present embodiment, the wiring board 10 includes the transparent substrate 11 and wiring pattern regions 20 disposed on the substrate 11, and each wiring pattern region 20 includes the first-direction wiring lines 21. The transparency of the wiring board 10 is ensured in this configuration. When the wiring board 10 is disposed on the display 91, the display 91 is visible through the openings 23 of each wiring pattern region 20, and the visibility of the display 91 is not obstructed by the wiring board 10.

Moreover, in the present embodiment, the wiring pattern region 20 includes the second-direction wiring lines 22 that connect the first-direction wiring lines 21 to one another. This can prevent the first-direction wiring lines 21 from breaking easily, which can reduce the likelihood of the first-direction wiring lines 21 malfunctioning.

Moreover, in the present embodiment, the protective layer 17 is formed so as to cover the wiring pattern regions 20 and the feeding units 40. The protective layer 17 can protect the wiring pattern regions 20 and the feeding units 40 against external shocks.

In the present embodiment, the through holes 45 are disposed in rows and columns at the surface of the feeding unit 40. This enables the protective layer 17 to be joined to the through holes 45 over a wide area of the feeding unit 40.

In the present embodiment, the through holes 45 are arranged at equal intervals at least in one direction. This enables the protective layer 17 to be joined to the through holes 45 with a substantially equal strength at the surface of the feeding unit 40.

For example, the feeding unit 40 may be joined to a circuit board of the image display device 90 using a joining member (not illustrated). In this case, since the feeding unit 40 has the through holes 45, the through holes 45 increase the surface area of the feeding unit 40 and thereby improve the adhesion between the feeding unit 40 and the joining member. An example of the joining member is an anisotropic conductive film (ACF). The circuit board described above may be a flexible circuit board, such as a flexible printed circuit (FPC).

Portable terminal devices for the fifth generation (5G) telecommunication networks have been developed in recent years. When a wiring pattern region 20 of the wiring board 10 is used as a 5G antenna (antenna for millimeter wave), the wiring pattern region 20 transmits and receives a radio wave (millimeter wave) of which the frequency is higher, for example, compared with a radio wave transmitted or received by a 4G antenna.

In general, when an alternating current is applied to a wiring line, the current is weakened in a central region of the wiring line as the frequency increases, and accordingly the current flows along the surface of the wiring line. The phenomenon that the alternating current applied to the wiring line flows only along the surface is referred to as a skin effect. The skin depth is a depth from the surface of the wiring line at which the current is reduced to 1/e (about 0.37) of the current along the surface of the wiring line, where the current most easily flows. The skin depth δ is generally determined by the following equation.

$$\delta = \sqrt{\frac{2}{\omega\mu\sigma}} \qquad \text{[Math. 1]}$$

In the above equation, ω is an angular frequency (=2πf), μ is a magnetic permeability (4π×10⁻⁷ [H/m] in vacuum), and a is an electrical conductivity of the conductor that forms the wiring line (5.8×10⁷ [S/m] for copper). The skin depth δ of a copper wiring line is δ=about 2.3 μm when the frequency is 0.8 GHz, δ=about 1.3 μm when the frequency is 2.4 GHz, δ=about 1.0 μm when the frequency is 4.4 GHz, and δ=about 0.85 μm when the frequency is 6 GHz. Radio waves (millimeter waves) transmitted and received by the 5G antenna are higher-frequency waves (28 GHz to 39 GHz) than radio waves transmitted and received by, for example, the 4G antenna. For example, δ=about 0.3 μm to about 0.4 μm when the frequency is 28 GHz to 39 GHz.

Accordingly, the current flows in a wiring line from the surface to the depth corresponding to the skin depth δ. Especially in the case of the wiring pattern region 20 transmitting and receiving high-frequency waves (for example, 28 GHz to 39 GHz), it is necessary to smooth the surfaces of the first-direction wiring lines 21 and the second-direction wiring lines 22 due to the skin depth δ being small. In the present embodiment, the wiring pattern regions 20 and the feeding units 40 are made simultaneously, and the surfaces of both the wiring pattern regions 20 and the feeding units 40 are thereby made smooth. Each feeding unit 40, however, is a member to which solder or a joining member (ACF) adheres, and it is necessary to improve the adhesion of the solder or the joining member (ACF) to the feeding unit 40. Accordingly, in the present embodiment, the through holes 45 are formed in the feeding unit 40 and thereby increase the surface area of the feeding unit 40, which can improve the adhesion of the solder or the joining member (ACF) to the feeding unit 40.

Modifications of Second Embodiment

Next, modifications of the wiring board according to the present embodiment will be described with reference to FIGS. 19 to 22. FIGS. 19 to 22 are views illustrating various modifications of the wiring board. In the modifications illustrated in FIGS. 19 to 22, the configuration of the wiring pattern region 20 or the feeding unit 40 is different from that described in the embodiment in relation to FIGS. 15 to 18, and other configurations are substantially the same. In FIGS. 19 to 22, the same components as those illustrated in FIGS. 15 to 18 are denoted by the same reference signs, and detailed descriptions thereof will be omitted.

Modification 1 of Second Embodiment

FIGS. 19(a) to 19(c) illustrate a wiring board 10G according to Modification 1 of the present embodiment. In the above embodiment, the through holes 45 are described by way of example as having respective square shapes in plan view and being disposed at lattice points at the surface of the feeding unit 40. The configuration of the through holes 45, however, is not limited to this. As illustrated in FIG. 19(a), the through holes 45 may have square shapes in plan view, and may be disposed in a staggered manner at the surface of the feeding unit 40. Alternatively, as illustrated in FIG. 19(b), the through holes 45 may have circular shapes in plan view, and may be disposed at lattice points at the surface of the feeding unit 40. Alternatively, as illustrated in FIG. 19(c), the through holes 45 may have rhombus shapes in plan view, and may be disposed at lattice points at the surface of the feeding unit 40. Moreover, each through hole 45 may be shaped, for example, like a parallelogram, a trapezoid, a triangle, a polygon such as a hexagon, or an ellipse, in plan view.

Modification 2 of Second Embodiment

FIGS. 20(a) and 20(b) illustrate a wiring board 10H according to Modification 2 of the present embodiment. As illustrated in FIGS. 20(a) and 20(b), the area of each through hole 45 and the pitch of the through holes 45 may be changed between a region of the feeding unit 40 closer to the wiring pattern region 20 and a region of the feeding unit 40 away from the wiring pattern region 20. For example, as illustrated in FIG. 20(a), the area of each through hole 45 (the width $W_4$ of the through hole 45) may be such that the area (width $W_4$) becomes gradually large as the distance from the wiring pattern region 20 becomes smaller, in other words, the area (width $W_4$) becomes gradually small as the distance from the wiring pattern region 20 becomes larger. Alternatively, as illustrated in FIG. 20(b), the pitch $P_4$ of the through holes 45 may be such that the pitch $P_4$ becomes gradually small as the distance from the wiring pattern region 20 becomes smaller, in other words, the pitch $P_4$ becomes gradually large as the distance from the wiring pattern region 20 becomes larger. This can lower the resistance of a region of the feeding unit 40 located away from the wiring pattern region 20 compared with the resistance of a region of the feeding unit 40 near the wiring pattern region 20. Accordingly, the resistance (impedance) can be controlled by adjusting the areas and the pitch of the through holes 45. This can make it easier to perform impedance matching, which becomes important especially in the frequency domain of millimeter wave or microwave or the like. In the present embodiment, the difference in impedance between the wiring pattern region 20 and the feeder line 95 can be reduced at the feeding unit 40 positioned at the connection portion between the wiring pattern region 20 and the feeder line 95.

Modification 3 of Second Embodiment

Figure 21:
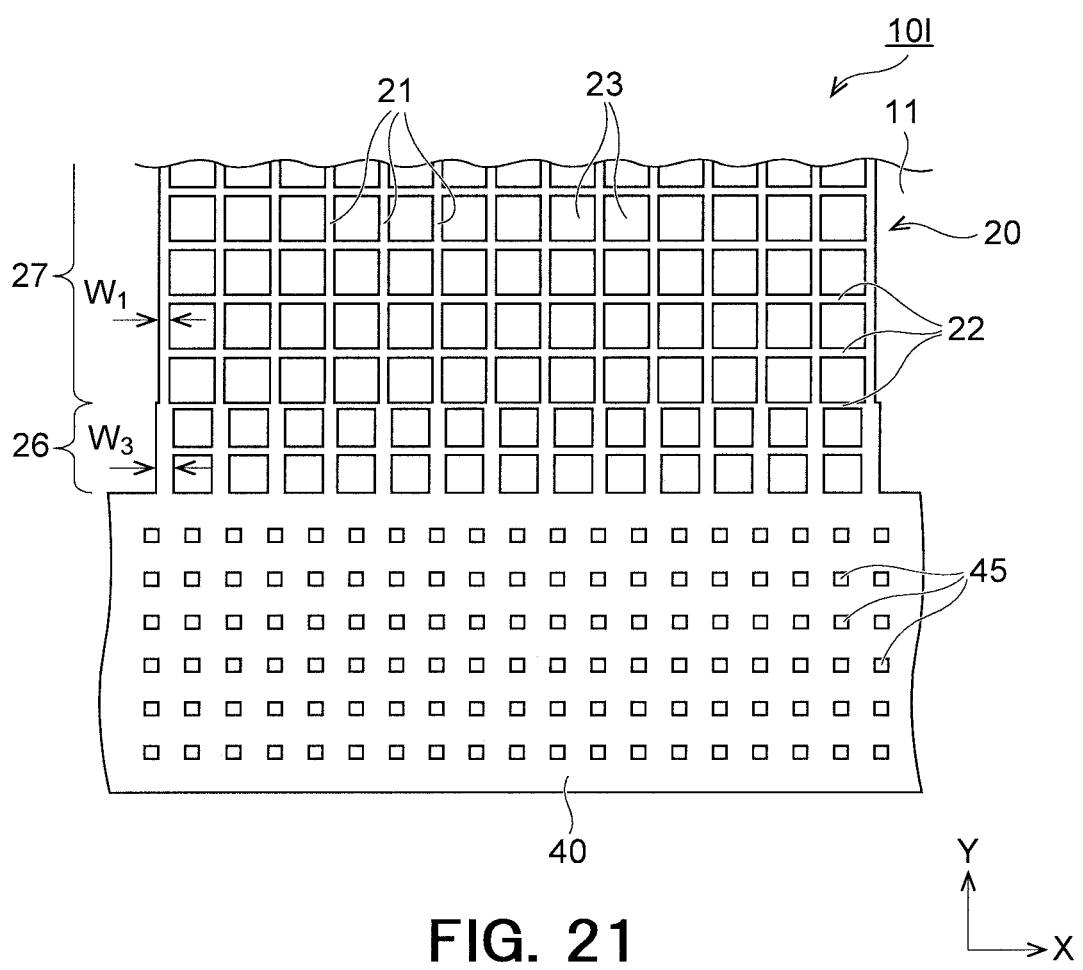
FIG. 21 is an enlarged plan view of a wiring board according to Modification 3 of the second embodiment.

FIG. 21 illustrates a wiring board 10I according to Modification 3 of the present embodiment. As illustrated in FIG. 21, the line width $W_3$ of each first-direction wiring line 21 in the first region 26 may be larger than the line width $W_1$ of the first-direction wiring line 21 in the second region 27 as is the case for the first embodiment. In this case, the resistance (impedance) of the first-direction wiring lines 21 can be controlled by adjusting the line width $W_3$ of each first-direction wiring line 21 in the first region 26, and the resistance (impedance) of the feeding unit 40 also can be controlled by adjusting the shapes and the number of through holes 45. This can make it easier to perform the above-described impedance matching between the first-direction wiring lines 21 and the feeding unit 40.

Modification 4 of Second Embodiment

Figure 22:
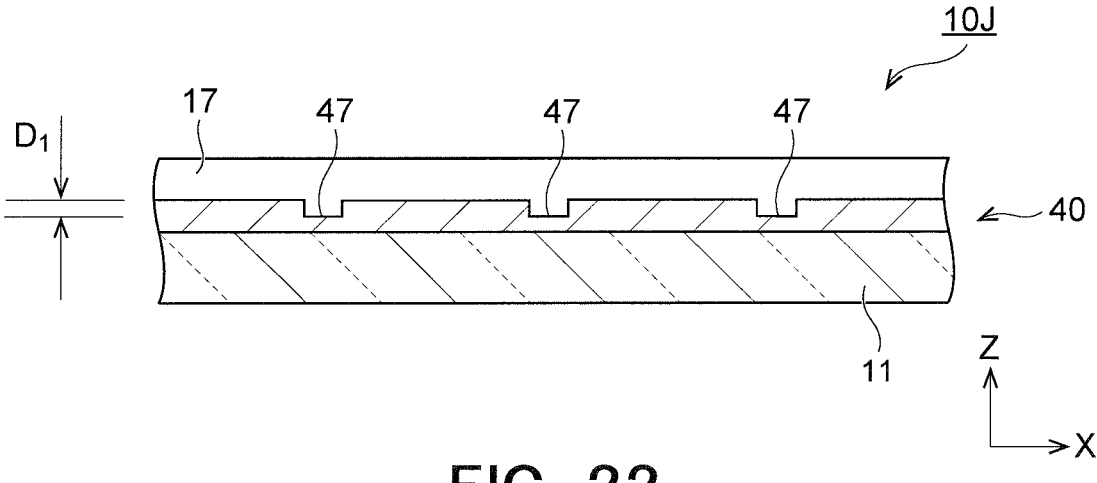
FIG. 22 is a sectional view of a feeding unit of a wiring board according to Modification 4 of the second embodiment.

FIG. 22 illustrates a wiring board 103 according to Modification 4 of the present embodiment. As illustrated in FIG. 22, the feeding unit 40 may have non-through holes 47 in place of the through holes 45. In plan view, the non-through holes 47 are disposed at lattice points on the feeding unit 40. In other words, the non-through holes 47 are arranged in rows and columns at the surface of the feeding unit 40. In other words, the non-through holes 47 are arranged side by side in the X direction and also side by side in the Y direction. The non-through holes 47 do not extend through the feeding unit 40 in the thickness direction (Z direction). The depth $D_1$ of each non-through hole 47 may be set in the range of 0.1 μm to 3.0 μm. The non-through holes 47 can be formed in the feeding unit 40, in the step of removing the conductive layer 51 from the front surface of the substrate 11 (see FIG. 6(h)), by covering the feeding unit 40 with a resist or the like and leaving the conductive layer 51 at the surface of the feeding unit 40. The shapes of the non-through holes 47 in plan view and the arrangement of the non-through holes 47 may be substantially the same as those described for the through holes 45.

Although the wiring pattern regions 20 function as antennas in the examples described above with reference to FIGS. 15 to 22, the wiring pattern regions 20 are not limited to this.

The wiring pattern regions 20 may instead have functions of, for example, hovering (function for enabling a user to operate without touching a display), fingerprint authentication, heating, or noise filtering (shielding).

The components of the above-described embodiments and modifications may be appropriately combined with one another as necessary. Also, some of the components may be omitted from the above-described embodiment and modifications.

The invention claimed is:

1. A wiring board, comprising:
a substrate that is transparent;
a mesh-like wiring pattern region disposed on the substrate and having wiring lines; and
a feeding unit electrically connected to the wiring lines of the wiring pattern region and having a surface located on a same plane with a surface of the mesh-like wiring pattern region,
wherein the feeding unit has through holes or non-through holes,
wherein a pitch of the through holes or the non-through holes is 100 μm or more and 500 μm or less, and
wherein the pitch is a length of a metal portion between the through holes adjacent to each other, or a length of a metal portion between the non-through holes adjacent to each other.

2. The wiring board according to claim 1, wherein the through holes or the non-through holes are arranged in rows and columns at a surface of the feeding unit.

3. The wiring board according to claim 1, wherein the through holes or the non-through holes are disposed at equal intervals at least in one direction.

4. The wiring board according to claim 1, wherein a width of each through hole or each non-through hole is 50 μm or more and 500 μm or less.

5. The wiring board according to claim 1, wherein a protective layer is formed on the substrate so as to cover the wiring pattern region and the feeding unit.

6. The wiring board according to claim 5, wherein
the protective layer has protrusions that protrude toward the substrate, and the protrusions of the protective layer enter the through holes or the non-through holes of the feeding unit.

7. The wiring board according to claim 1, wherein a line width of each wiring line is in a range of 0.1 μm to 5.0 μm.

8. The wiring board according to claim 1, wherein the wiring pattern region functions as an antenna.

9. The wiring board according to claim 1, wherein an area of each through hole or each non-through hole or a pitch of the through holes or the non-through holes in a region of the feeding unit near the wiring pattern region is different from an area of each through hole or each non-through hole or a pitch of the through holes or the non-through holes in a region of the feeding unit away from the wiring pattern region.

10. A method for manufacturing a wiring board, the method comprising:
a step of preparing a substrate that is transparent; and
a step of forming a mesh-like wiring pattern region having wiring lines and forming a feeding unit electrically connected to the wiring lines on the substrate, the wiring pattern region and the feeding unit being formed on the substrate and having a surface located on a same plane with a surface of the mesh-like wiring pattern region,
wherein the feeding unit has through holes or non-through holes,
wherein a pitch of the through holes or the non-through holes is 100 μm or more and 500 μm or less, and
wherein the pitch is a length of a metal portion between the through holes adjacent to each other, or a length of a metal portion between the non-through holes adjacent to each other.

\* \* \* \* \*